(12) United States Patent
Zickel et al.

(10) Patent No.: US 9,942,950 B2
(45) Date of Patent: Apr. 10, 2018

(54) METHOD FOR DETECTING DARK DISCHARGE AND DEVICE UTILIZING THE METHOD

(71) Applicant: GOJI LIMITED, Hamilton (BM)

(72) Inventors: Ben Zickel, Qiryat Bialik (IL); Eliezer Gelbart, Holon (IL)

(73) Assignee: GOJI LIMITED, Hamilton (BM)

( * ) Notice: Subject to any disclaimer, the term of this patent is extended or adjusted under 35 U.S.C. 154(b) by 554 days.

(21) Appl. No.: 14/419,750

(22) PCT Filed: Aug. 6, 2013

(86) PCT No.: PCT/IB2013/002195
§ 371 (c)(1),
(2) Date: Feb. 5, 2015

(87) PCT Pub. No.: WO2014/024044
PCT Pub. Date: Feb. 13, 2014

(65) Prior Publication Data
US 2015/0223294 A1    Aug. 6, 2015

Related U.S. Application Data

(60) Provisional application No. 61/679,843, filed on Aug. 6, 2012.

(51) Int. Cl.
*H05B 6/50* (2006.01)
*H05B 6/68* (2006.01)
(Continued)

(52) U.S. Cl.
CPC .............. *H05B 6/68* (2013.01); *G01R 27/04* (2013.01); *H05B 6/6447* (2013.01); *H05B 6/688* (2013.01);
(Continued)

(58) Field of Classification Search
CPC . H05B 6/68; H05B 6/705; H05B 6/80; H05B 6/72; H05B 6/645; H05B 6/6447;
(Continued)

(56) References Cited

U.S. PATENT DOCUMENTS 3,883,958 A * 5/1975 Filipe ..................... F26B 3/34
34/289
5,321,897 A 6/1994 Hoist et al.
(Continued)

FOREIGN PATENT DOCUMENTS

EP       2418916 A1    2/2012
WO    01/57457 A1    8/2001
(Continued)

OTHER PUBLICATIONS

Search report from PCT/IB2013/002195, dated Dec. 30, 2013.
International Preliminary Report on Patentability for PCT Application PCT/IB2013/002195 dated Feb. 10, 2015.

*Primary Examiner* — Hung D Nguyen
(74) *Attorney, Agent, or Firm* — Greenblum & Bernstein, P.L.C.

(57) ABSTRACT

A method of applying RF energy to an object in a cavity is disclosed. In some embodiments, the method may include applying to the object a first amount of RF energy at power increasing from an initial power level to a final power level; and if an electrical discharge occurs, stopping RF energy application for a period sufficient to allow the electrical discharge to decay. The method may further include applying to the object a second amount of RF energy after the period ends. The second amount of RF energy may be applied at intermediate power, higher than the initial power level and lower than the final power level.

14 Claims, 12 Drawing Sheets

(51) Int. Cl.
  *H05B 6/70* (2006.01)
  *H05B 6/80* (2006.01)
  *H05B 6/64* (2006.01)
  *G01R 27/04* (2006.01)

(52) U.S. Cl.
  CPC .............. *H05B 6/705* (2013.01); *H05B 6/80* (2013.01); *Y02B 40/146* (2013.01)

(58) Field of Classification Search
  CPC ...... H05B 6/6402; H05B 6/666; H05B 6/647; H05B 6/6464; H05B 6/687; H05B 6/688; H05B 6/707; G01R 27/04
  USPC ..... 219/702, 707, 709, 745, 746, 748; 34/92
  See application file for complete search history.

(56) References Cited

U.S. PATENT DOCUMENTS

| | | | |
|---|---|---|---|
| 5,420,404 A * | 5/1995 | Goodman | B29B 13/065 219/772 |
| 7,525,074 B2 | 4/2009 | Bostick et al. | |
| 7,995,313 B2 | 8/2011 | Nitschke | |
| 8,839,527 B2 | 9/2014 | Ben-Shmuel et al. | |
| 2004/0177923 A1 | 9/2004 | Kuriyama | |
| 2005/0221000 A1 * | 10/2005 | Ikeda | C23C 16/02 427/248.1 |
| 2006/0156984 A1 * | 7/2006 | Nozawa | H01J 37/32192 118/723 R |
| 2007/0278220 A1 | 12/2007 | Bostick et al. | |
| 2009/0057302 A1 | 3/2009 | Ben-Shmuel et al. | |
| 2012/0103973 A1 | 5/2012 | Rogers | |
| 2013/0080098 A1 | 3/2013 | Hadad et al. | |
| 2013/0200065 A1 | 8/2013 | Libman et al. | |
| 2013/0200066 A1 | 8/2013 | Gelbart et al. | |
| 2013/0248521 A1 | 9/2013 | Torres et al. | |
| 2013/0306627 A1 | 11/2013 | Libman et al. | |
| 2014/0247060 A1 | 9/2014 | Ben Haim et al. | |
| 2014/0287100 A1 | 9/2014 | Libman | |
| 2014/0345152 A1 | 11/2014 | Ben-Shmuel et al. | |
| 2015/0034632 A1 | 2/2015 | Brill et al. | |
| 2015/0070029 A1 | 3/2015 | Libman et al. | |

FOREIGN PATENT DOCUMENTS

| | | |
|---|---|---|
| WO | 2012/051198 A1 | 4/2012 |
| WO | 2013/033330 A2 | 3/2013 |

* cited by examiner

METHOD FOR DETECTING DARK DISCHARGE AND DEVICE UTILIZING THE METHOD

This application claims priority to U.S. Provisional Application No. 61/679,843, filed on Aug. 6, 2012, the disclosure of which is expressly incorporated herein by reference in its entirety.

TECHNICAL FIELD

This application relates to methods and devices for applying RF energy to objects, and more particularly, but not exclusively, to such methods and devices that allow detecting, and/or reducing electrical discharges.

BACKGROUND

Under some circumstances, RF energy application may be accompanied by an electric discharge. For example, if a metallic spoon is put in a microwave oven, operation of the oven may generate a spark between the spoon and the walls of the oven. This spark is a kind of electric discharge. An electric discharge may be caused by ionization of some of the medium in which the discharge happens. The discharge may be expressed by electrical currents going through air or other insulator between two conductors. The discharge may have different properties depending on the intensity of the electric field that produced it. At fields of lower intensity, a dark discharge may be generated. At somewhat higher fields, a corona discharge may take place. The corona discharge may be accompanied with emission of visible photons. At higher fields, sparks or arcs may form, in a process known as arcing.

SUMMARY

Some exemplary aspects of the invention may be directed to a method of applying RF energy to an object in a cavity. The method may comprise: applying to the object a first amount of RF energy at power increasing from an initial power level to a final power level; if an electrical discharge occurs, stopping RF energy application for a period sufficient to allow the electrical discharge to decay; and after the period ends, applying to the object a second amount of RF energy, at intermediate power, higher than the initial power level and lower than the final power level. In the present description and claims, RF energy application to the object may be accomplished by applying the energy to the energy application zone (e.g., to the cavity). Energy application to the energy application zone and energy application to the object are used herein interchangeably, and refer to a process of energy application to the cavity, which may cause some energy to be applied to the object. The amount of energy applied to the energy application zone may be considered, in some cases, to be the same as the amount of energy applied to the object.

In some embodiments, the second amount of RF energy may be greater than the first amount of RF energy, e.g., by a factor of 50 times or more.

In some embodiments, the period, for which RF energy application is stopped, is predetermined. For example, this period may be predetermined based on analytical calculations and/or simulations that estimate the life time of a discharge in the cavity. The stopping period may be set, for example, to 5 life times or longer. In some embodiments, the stopping period may be predetermined to 10 milliseconds (ms) or more. In some embodiments, the period, for which RF energy application is stopped, may be determined through detection. For example the RF energy may be stopped until a detector detects that the electrical discharge has decayed to some predetermined degree, e.g., completely or below a detectable threshold. In some embodiments, the detector may detect one or more s parameters or other response parameters and the discharge is detected to be completely decayed when the detected one or more parameters stabilize, e.g., the variation of the one or more parameters are within a predetermined range.

In some embodiments, the electric discharge takes place within 10 ms before the stopping. For example, once discharge is detected, RF energy application may be stopped within 10 ms.

In some embodiments, the method may further comprise: applying RF energy at a series of at least two energy application events at decreasing power levels with an intermission between each two succeeding energy application events. In some embodiments, the intermission may be sufficiently long to allow decay of plasma if occurred. In some embodiments, the intermission may be of 10 ms or more.

In some embodiments, electric discharge precedes each intermission.

In some embodiments, the method may further comprise applying a third amount of RF energy at a power level lower than a power level of a penultimate energy application event in the series.

In some embodiments, the third amount of RF energy may be applied at a power level higher than a power level of a last energy application event in the series. For example, if the series included 10 energy application events, the third power level may be lower than the power level of the $9^{th}$ energy application event, e.g., intermediate between the $9^{th}$ and $10^{th}$ energy application events in the series.

In some embodiments, the method may further comprise: determining a difference between values of a response parameter measured responsive to energy applications at first and second power levels; and continuing energy application based on the difference.

In some embodiments, if the difference is smaller than a significance threshold, continuing energy application comprises applying energy at a power level equal to or higher than the higher of the first and second power levels. In some embodiments, the method may continue by comparing a value of a response parameter measured responsive to the last energy application to a value of the response parameter measured responsive to the energy application that preceded the last one.

In some embodiments, if the difference is larger than a significance threshold, continuing energy application comprises stopping RF energy application. The stopping may be to a period sufficient to allow dark discharge to decay completely. The duration of this period may be determined through detection, for example detecting the discharge decay, or predetermined, for example, based on analytical calculations and/or simulations that estimate the life time of a discharge in the cavity. In some embodiments, the stopping period may be at least 10 ms.

In some embodiments, if the difference is larger than the significance threshold, continuing energy application further comprises renewing RF energy application at a power level lower than the higher of the first and second power levels.

In some embodiments, the response parameter may be selected from the group consisting of: S parameters, Z parameters, T parameters, ABCD parameters, gamma parameters, dissipation ratios, and combinations of two or more thereof.

In some embodiments, a response of the object to the energy application at the final power level is significantly different from a response of the object to the energy application at the initial power level.

The response of the object may comprise one or more of: an S parameter, a T parameter, a Z parameter, an ABCD parameter, a gamma parameter, a dissipation ratio, or a combination of two or more thereof.

Some exemplary aspects of the invention may be directed to a method of applying RF energy at multiple excitation setups to an object in a cavity. In some embodiments, RF energy application at each of the multiple excitation setups may comprise: applying to the object, at said each of the multiple excitation setups, a first amount of RF energy at power increasing from an initial power level to a final power level; stopping RF energy application for a period of 10 milliseconds or more; and applying to the object, at a first excitation setup, a second amount of RF energy, at intermediate power, higher than the initial power level and lower than the final power level at which the first amount of energy was applied at the first excitation setup. In some embodiments, there may be an intermission between application of the first and second amounts of energy at one of the first and second excitation setup. During the intermission, RF energy application at both first and second excitation setups may be ceased.

In some embodiments, stopping RF energy application may comprise stopping at multiple excitation setups in the same time.

In some embodiments, energy applications at differing excitation setups may interlace. For example, each energy application event at one excitation setup may be followed by energy application event at the second excitation setup. In some embodiments, energy application at two excitation setups may happen at overlapping times.

Some exemplary aspects of the invention may be directed to a method of applying RF energy to a system comprising an object in a cavity. The method may comprise: comparing two values of a response parameter measured in the system in response to RF energy application at a common excitation setup and at differing power levels; and applying RF energy to the system based on results of the comparison.

In some embodiments, applying RF energy based on the results of the comparison may comprise stopping RF energy application if a difference between the two values is larger than a significance threshold. The stopping may be sufficient to allow a dark discharge, if occurred, to completely decay. For example, in some embodiments, the stopping may be for a period of at least 10 ms.

In some embodiments, applying RF energy based on the results of the comparison comprises applying RF energy at a power level lower than the higher of the differing power levels if a difference between the two values is larger than a significance threshold.

In some embodiments, applying RF energy based on the results of the comparison may comprise applying energy at a power level higher than the higher of the differing power levels if a difference between the two values is smaller than a significance threshold.

In some embodiments, the response parameter may be selected from the group consisting of S parameters, Z parameters, T parameters, ABCD parameters, gamma parameters, dissipation ratios, and combination of two or more of the above.

In some embodiments, the excitation setup may be defined by a frequency value. In some embodiments, the excitation setup may be defined by phase and/or amplitude values for each antenna.

Some exemplary aspects of the invention may be directed to an apparatus for processing an object in a cavity by RF energy supplied by an RF source to the cavity through a feed. The apparatus may comprise a processor configured to: cause application of RF energy by the source through the feed to the cavity at a controlled power level; determine values of a response parameter of the object in the cavity to RF energy applied at differing power levels; compare values of a response parameter measured at differing power levels; and cause application of RF energy by the source based on results of the comparison.

In some embodiments, the processor may be configured to stop RF energy application, e.g., for 10 ms or more, if a difference between the two values is larger than a significance threshold.

In some embodiments, the processor may be configured to cause application of RF energy at a power level lower than the higher of the differing power levels if a difference between the two values is larger than a significance threshold.

In some embodiments, the processor is configured to cause application of RF energy at a power level higher than the higher of the differing power levels if a difference between the two values is smaller than a significance threshold.

In some embodiments, the response parameter is selected from the group consisting of field intensity, field amplitude, S parameters, Z parameters, T parameters, ABCD parameters, Γ parameters, dissipation ratios, and combination of two or more of the above.

In some embodiments, the excitation setup is defined by a frequency value. In some embodiments, the excitation setup may be defined by phase and/or amplitude values for each antenna.

In some embodiments, the apparatus may further comprise a vacuum pump configured to evacuate gases from vicinity of the object and a cooler configured to cool the object.

In some embodiments, the apparatus may be configured to freeze-dry the object.

Some exemplary aspects of the invention may be directed to an apparatus for applying RF energy to an object in a cavity. The apparatus may comprise a processor configured to: cause application of a first amount of RF energy to the object at power increasing from an initial power level to a final power level; stopping RF energy application following an occurrence of an electrical discharge, for a period sufficiently long to allow the electrical discharge to decay, e.g., completely; and after the period ends, causing application of a second amount of RF energy to the object, at intermediate power, higher than the initial power level and lower than the final power level.

In some embodiments, the second amount of RF energy is greater than the first amount of RF energy, by a factor of 50 or more.

In some embodiments, the period is of 10 milliseconds (ms) or more.

In some embodiments, the processor may be configured to stop the energy application within the first 10 ms after the electrical discharge.

In some embodiments, the processor may be further configured to: cause application of RF energy at a series of at least two energy application events at decreasing power levels with an intermission of 10 ms or more between each two succeeding energy application events of the series.

In some embodiments, the processor may be further configured to: cause application of a third amount of RF energy at a power level lower than a power level of a one-before-last energy application event in the series.

In some embodiments, the processor may be configured to cause the application of the third amount of RF energy at a power level higher than a power level of a last energy application event in the series.

In some embodiments, the processor may be further configured to: determine a difference between values of a response parameter measured responsive to energy applications at first and second power levels; and regulate energy application to the object based on the difference.

In some embodiments, the processor may be configured to compare the difference to a threshold, and cause application of RF energy at a power level equal to or higher than the higher of the first and second power levels if the difference is smaller than the threshold.

In some embodiments, the processor may be configured to compare the difference to a threshold, and stop application of RF energy if the difference is larger than the threshold.

In some embodiments, the response parameter is selected from the group consisting of electrical field amplitude, electrical field intensity, S parameters, Z parameters, T parameters, ABCD parameters, gamma parameters, dissipation ratios, and combinations of two or more thereof. Some embodiments of the invention may include a method of heating an object in an energy application zone by applying RF energy to the energy application zone without causing a visible electrical discharge. The method may include: applying RF energy to the energy application zone at a first power level, measuring a value of an electromagnetic response parameter indicative of the electromagnetic response of the energy application zone to the RF energy application; intermitting the application of RF energy after the value of the electromagnetic response parameter is measured to be outside a predetermined range and before visible electrical discharge occurs; and renewing RF energy application after the intermission at a second power level, wherein the second power level is lower than the first power level. In some embodiments, the method may include an apparatus for heating an object in an energy application zone by applying RF energy to the energy application zone without causing a visible electrical discharge. The apparatus may include a processor configured to: cause application of RF energy to the energy application zone at a first power level, receive a value of an electromagnetic response parameter measured in response to the caused application of RF energy, the electromagnetic response parameter being indicative of the electromagnetic response of the energy application zone to the caused RF energy application; cause intermission in the application of RF energy after the received value of the electromagnetic response parameter is outside a predetermined range and before visible electrical discharge occurs; and cause renewal of the RF energy application after the intermission at a second power level, wherein the second power level is lower than the first power level.

The drawings and detailed description which follow contain numerous alternative examples consistent with the invention. A summary of every feature disclosed is beyond the object of this summary section. For a more detailed description of exemplary aspects of the invention, reference should be made to the drawings, detailed description, and claims, which are incorporated into this summary by reference.

DETAILED DESCRIPTION

Figure 1:
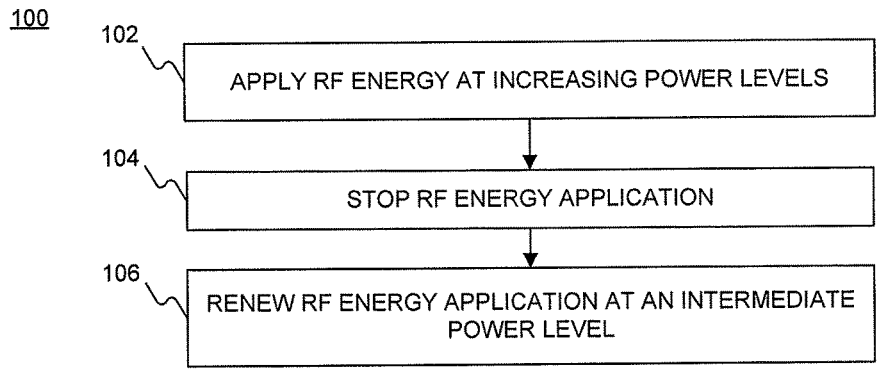
FIG. 1 illustrates a flowchart showing an exemplary method of RF energy application in accordance with some exemplary embodiments of the present invention.

An aspect of some embodiments of the invention may include a method of processing (e.g., heating and/or sublimating) an object by RF energy. Another aspect of some embodiments may include an apparatus utilizing the method. The object to be processed may include biological material (e.g., blood plasma), food (e.g., coffee, ice cream, fruits), pharmaceuticals, or any other objects that may benefit from heating by RF or microwave, and especially objects that may be freeze-dried, since some embodiments described herein are particularly useful for providing arcing-free freeze drying. In some embodiments, the object to be processed may be provided in a vial, syringe, or container of any other kind or shape. The object to be processed may be inside an RF resonator, cavity, or waveguide, which may also be referred to as energy application zones. The energy application zone may resonate in the frequency range of the RF radiation used for the processing. For example, the energy application zone may have a cutoff frequency lower than a frequency used for the processing. Processing an object may include, for example, cooking, thawing, drying, or freeze-drying. In some embodiments, for example, in freeze drying, the processing may be under conditions that enhance arcing, for example, pressure of around 0.5-1 tor.

In some embodiments, plasma generation may be omitted altogether or reduced in comparison to processing in known methods, and therefore, may be less desirable for processing that relies on plasma generation. In some embodiments, dark discharge, which usually precedes corona discharge, may be detected and/or controlled, e.g., initiated and/or eliminated. The method may include a search for a discharge power threshold, above which corona discharge and/or arcing may be expected. The method may further limit RF application to power levels lower than the discharge power threshold. The method may rely on a finding that dark discharge may appear at lower power levels than corona discharge or arcing, and therefore, the onset of dark discharge may serve as an upper limit for power application, when arcing or corona discharge is to be avoided. Thus, the dark discharge onset power may be a discharge power threshold, above which corona discharge and/or arcing may be expected. Electrical discharge accompanied with emission of visible photons, including, for instance, corona discharge and arcing, is referred to herein collectively as visible discharge. Visible photons are photons in the wavelength range of between 400 nm and 700 nm.

In some embodiments, the dark discharge onset power may be identified as a power level at which an electromagnetic response parameter starts showing unexpected dependency on power. The electromagnetic response parameter may be any parameter indicative of the electromagnetic response of the object in the cavity to an incoming electrical signal, for example, the response to the RF energy applied for processing the object. The electromagnetic response parameter may be one that shows power independence or known power dependency at low power levels. For example, S parameters show no power dependency at low power levels, while field amplitude and intensity show known dependencies on the input power level. Accordingly, the electromagnetic response parameter (also referred to herein as a response parameter) may include, for example, electrical field intensity at one or more places inside the cavity, a network parameter (e.g., S, T, Z, or ABCD parameter), rewinding voltage, rewinding current, a relation between rewinding and forwarding voltage or current, a gamma parameter, a dissipation ratio, a combination of two or more of them, etc. In this connection, a combination of parameters may be obtained by mathematically manipulating one or more of the parameters. For example, the dissipation ratios discussed below may be considered combinations of s parameters, since they can be mathematically represented as functions of the s parameters. In some embodiments, finding the discharge power threshold (e.g., at an end of a search for it) may include causing dark discharge.

A search for the dark discharge onset power (also referred to herein as discharge power threshold), may include application of RF energy at increasing power levels, starting from a power level ascertained to be below the dark discharge onset power. Alternatively, a search for the discharge power threshold may include application of RF energy at decreasing power levels, starting from a power level above the discharge power threshold. In the latter case, electrical discharge, preferably dark discharge, repeatedly happens during the search. In the former case, dark discharge happens during the search, but only near the end of the search, when the threshold is found.

In some embodiments, the dark discharge onset power may be identified as a power level at which a response parameter starts showing dependence on power. The response parameter may be one that shows power independence, or known power dependency at low power levels. Accordingly, the response parameter may include, for example, amplitude or intensity of an electric field at one or more locations inside the energy application zone, a network parameter (e.g., S, T, Z, or ABCD parameter), rewinding voltage, rewinding current, a relation between rewinding and forwarding voltage or current, a gamma parameter, a dissipation ratio, a combination of two or more of them, etc. In some embodiments, finding the discharge power threshold (e.g., at an end of a search for it) may include causing dark discharge.

In some embodiments, after the threshold is found, RF power application may be stopped (or continued only at very low power levels) for an intermission period. The intermission period may be sufficiently long to allow the ionization that caused the dark discharge to decay to the background ionization level. Such decay may be referred to as a complete decay. The length of the intermission period may be predetermined to be any suitable period, such as, for example, 10 milliseconds (ms), 20 ms, or 30 ms. The predetermination may be based on past experience with the system, simulations, and/or analytical calculations that may provide an estimate of a preferred length of intermission. In some embodiments, the intermission period may be determined during the practicing of the method. Finding an appropriate intermission period may include a step, or a plurality of steps, in the method. It was found that in the absence of an intermission period, a discharge may continue even after the power is reduced to below the discharge power threshold. After the discharge decays, energy application may take place at a power level lower than the discharge power threshold, without causing a discharge.

In some embodiments, it is considered that the discharge power threshold may change dynamically, for example, due to changes of the object (such as drying, heating, puffing, collapsing, etc.) or changes in conditions (such as changes in pressure, temperature, etc.) that may take place during the processing. In such embodiments, the threshold may be dynamically updated, e.g., by searching for new discharge power thresholds after a first threshold was found. For example, in some embodiments, energy may be applied, continuously or intermittently, at a constant power level found to be below the discharge power threshold for a processing period of a predetermined length (e.g., 10 minutes). After the processing period has lapsed, a search for a new threshold may take place, e.g., by increasing the power starting from the constant power level, at which no discharge was detected for the entire processing period. Once such new threshold is found, RF energy may be applied at a new constant power level lower than the new threshold for another processing period that may also be of the predetermined length. The new power level may be higher than the power level used during the preceding processing period. In some embodiments, an upper power threshold may be defined, above which energy is not applied even if discharge does not occur. For example, it may happen that too high RF power may damage the object to be processed irrespective of arcing. In some embodiments, a discharge power threshold is not searched above the upper power threshold.

In some embodiments, an upper threshold may be defined for an absorbed power, which may be equated with the multiplicative product of the applied power by a dissipation ratio. In such embodiments, the applied power may be reduced irrespective of the position of the discharge power threshold, to prevent absorption of power above a power absorption threshold.

Additionally or alternatively, during energy application at a constant power level found to be below a discharge power threshold, the response parameter may be monitored to ensure it does not change too rapidly. Some change of the response parameter may be expected due to changes that may occur in the object during its processing. However, larger or faster changes may be indicative of an upcoming arcing. Therefore, in some embodiments, if such an abrupt or large change in the response parameter is found, energy application may be stopped for another intermission period, and may be renewed at a lower power level, searching this way for a new discharge power threshold, this time, going down from above the threshold.

In some embodiments, a discharge power threshold may change in time, and the input power may follow this change so as to be near the discharge power threshold. When methods of some embodiments are practiced, dark discharge may happen relatively frequently (e.g., every 5 minutes or so), while corona discharge may be completely (or nearly completely) prevented. Some of the dark discharge events may be initiated during the search for the highest power that may be applied without discharge. Some of the dark discharge events may happen because the discharge power threshold decreases, but in both events, the ability to detect the discharge at the dark discharge phase may allow preventing the development of plasma or corona discharge, and even more so may allow prevention of arcing. A decrease in the threshold may be identified, for example, by measuring a response parameter during energy application at a power level that was found to be free of electric discharge. If there is a significant change at the same power level between measurements taken at different times, this may indicate the existence of a dark discharge.

In some embodiments of the present disclosure, RF power may be applied at multiple frequencies, phases, or more generally, at multiple excitation setups. As explained in detail below, an excitation setup may be a setup of an energy application unit applying RF energy to an energy application zone. Energy application at differing excitation setups may result in exciting differing field patterns in the energy application zone. It was found that at differing excitation setups, differing discharge power thresholds may apply. Therefore, in some embodiments, the method may be practiced at each excitation setup independently of the other excitation setups. It is noted, however, that in some embodiments an intermission that follows energy application above a discharge power threshold at one excitation setup may include stopping power application at all excitation setups.

FIG. 1 is a flowchart of an exemplary method 100 of RF energy application for processing an object according to some embodiments. It is noted that, in the present disclosure, the term 'exemplary' is used in the sense of serving as an instance, example, or illustration, and not necessarily as excellent or deserving imitation. The term RF energy, as used herein, includes energy deliverable by electromagnetic radiation in the radio frequency (RF) portion of the electromagnetic spectrum. RF energy may be deliverable by electromagnetic radiation having a wavelength in free space of 100 km to 1 mm, which corresponds to a frequency of 3 KHz to 300 GHz, respectively. In some examples, the applied RF energy may fall within frequency bands, for example, between 500 MHz to 1500 MHz or between 2400 MHz to 2500 MHz or between 800 MHz-1 GHz. Application of energy deliverable by electromagnetic radiation in the RF portion of the electromagnetic spectrum is referred herein as RF energy application. Microwave and ultra high frequency (UHF) energy, for example, are both within the RF range. In some other examples, the applied electromagnetic energy may fall only within one or more Industrial, Scientific and Medical (ISM) frequency bands, for example, between 433.05 MHz and 434.79 MHz, between 902 MHz and 928 MHz, between 2400 MHz and 2500 MHz, and/or between 5725 MHz and 5875 MHz.

Method 100 includes step 102, at which RF energy may be applied at increasing power levels, e.g., a first amount of RF energy may be applied at power increasing from an initial power level to a final power level. In some embodiments, the power may increase monotonically. In other embodiments, the power may go up and down keeping an overall tendency to increase. In some embodiments, step 102 may include a series of RF energy application events, each at a power level, for example, a power level that stays constant for the entire energy application event.

An energy application event may take place at any time period, during which energy is applied continuously at a single excitation setup. Stopping energy application may end an energy application event, and switching to another excitation setup may end one energy application event and start another one. The first power application event in the series may be at a power level lower than that of the last power application event. In some embodiments, the power levels constantly increase from one energy application event to the next. In some embodiments, the series may include power increases and power decreases. For example, in some embodiments, a third energy application in the series may be at an intermediate power level, between the power level of the first and second events in the series.

In some embodiments, step 102 may end when an electric discharge (e.g., dark discharge) is detected. Thus, an electric discharge may take place only at the end of the energy application, for example, when RF energy is applied at the final power level. In embodiments where the first amount of RF energy is applied in a series of energy application events, the discharge may occur only at the last energy application event, and not at earlier ones. In some embodiments, method 100 may further include determination whether a discharge occurred or not, and when a discharge is determined to have occurred, energy application may be stopped for a while, in step 104. In some embodiments, determination of the existence of the discharge may include determining a difference between values of a response parameter, indicative of the response of the system (e.g., response of the object in the cavity) to energy applications at first and second power levels (e.g., at two power levels applied in step 102).

A response parameter may be any parameter calculated based on electric potentials and/or currents at an entrance to the energy application zone, in forward or backward direction. Examples of response parameters may include, for example, $V_{out}/V_{in}$, $J_{out}/J_{in}$, $J_{out}/J_{in}$, $P_{out}/J_{in}$, $V_{ref}/V_{in}$, $V_{cp}/V_{in}$, etc., wherein V stands for voltage J for current, and P for power; and the subscripts "in", "out", "ref" and "cp" stand for input, output, reflected, and coupled, respectively. Input current or voltage may be measured at one or more radiating elements in forward directions (i.e., going into the cavity). Output current or voltage may be measured at one or more radiating elements in a backward direction (i.e., going out of the cavity). Reflected voltage or current may be measured, at the backward direction, at a radiating element that inputs current and/or power into the cavity when all the other radiating elements are silent. Coupled power or current may be measured in a direction going out of a silent radiating element. Some examples of response parameters may include S parameters, other network parameters, absolute values thereof, phases thereof, dissipation ratios, gamma parameters, etc. As used herein, the term "radiating element" may broadly refer to any structure configured to radiate and/or receive RF energy. For example, a radiating element may include an antenna, e.g., an aperture/slot antenna, a plurality of terminals emitting in unison, either at the same time or at a controlled dynamic phase difference (e.g., a phased array antenna).

As noted above, method 100 may include a step 104 of stopping RF energy application for an intermission period. The intermission period may start immediately after a discharge was detected to have occurred, for example, within 10 ms or less from discharge detection. RF energy application may be considered to stop if the power decreases to below a minimal power level or, in some embodiments, to 0. In some embodiments, the intermission may be total, in the sense that during the intermission, RF energy is not applied at any of the excitation setups to process the object. In other embodiments, RF energy application may continue, during the intermission, at one or more excitation setups, at which dark discharge was not detected. Some RF energy may be applied, e.g., for communication purposes. For example, the object may carry an RFID, and this RFID may be read during the intermission.

The intermission may be sufficiently long to allow a discharge to decay. The discharge may be, for example, one that occurred in response to energy application at the highest power level applied in step 102. In some embodiments, the intermission may come right after an electric discharge occurred, and may be long enough to allow the electric discharge to decay. That a discharge decayed may be checked, for example, by applying energy at a power level lower than the last applied before the intermission, and ensuring that the response parameter has the same value as measured at the same power before the intermission. In some embodiments, the intermission may last at least 10 ms, for example, the intermission may have a length of 10 ms, 20 ms, or 30 ms. In some embodiments, the length of the intermission may be predetermined. In some embodiments, the length of the intermission may be set dynamically during the operation. For example, intermissions of increasing lengths may be tried, and the shortest intermission after which discharge appears to decay may be determined as the intermission length. This intermission length may be used in a following event at which intermission is required. If it is then found not to be long enough, a longer intermission may be tried.

Method 100 may further include step 106, in which RF energy application may be renewed at an intermediate power level, lower than the highest power level applied in step 102, but higher than the lowest power level applied in step 102. In some embodiments, the power level applied at step 106 may be a power level of the one-before-last energy application event in a series of energy application events composing step 102. Energy application 106 may include one or more energy application events, and may last for a time period longer than any of the energy application events applied at step 102, e.g. by a factor of 10 (times) or more. For example, in some embodiments, the energy application events in step 102 may each have a length of between 1 ms and 10 ms, and the energy application of step 106 may have a length of between 1 s and 10 minutes. Similarly, the second amount of energy, applied in step 106, may be larger than the first amount of energy, applied in step 102, e.g., by a factor of 10, 50, 100 times or any suitable intermediate or larger factors. In some embodiments, the ratio between the initial power level and the final power level may be 20 or more, e.g., 50. The lower is the initial power, the higher is the certainty that no discharge will take place at the initial power level. If the system is well known, the search for the threshold may begin at higher power levels, close to a threshold found in earlier executions of the method. If the system is less well known, and past experience provides less information on the expected discharge onset power threshold, the search should begin at lower power levels. Thus, in some embodiments, for example, where flexibility is to be retained to heat a variety of different objects and/or under a variety of temperature and pressure conditions, the amplifier may have a dynamic range that allows working at power levels that differ from each other by a factor of at least 20 times, or at least 50 times. When flexibility is less important, amplifiers of a smaller dynamic range may be utilized.

Method 100 may be carried out at multiple excitation setups. For example, in some embodiments, the entire method may be carried out repetitively, with differing repetitions carried out at differing excitation setups. In some embodiments, the method may be carried out at multiple excitation setups in an interlacing manner. For example, in step 102 energy may be applied at an initial power level at each of a plurality of excitation setups, and then energy may be applied at a second, e.g., higher power level, at all the excitation setups at which dark discharge has not yet been detected. In excitation setups where dark discharge has been detected, the method may move forward to step 106, while in other excitation setups step 102 may still be carried out. In some embodiments, the intermission of step 104 may be taken at all excitation setups simultaneously, and in an excitation setup where discharge was not detected, the method may return to step 102 after the intermission, and continue to step 106 only after discharge has been detected in that excitation setup.

Figure 2:
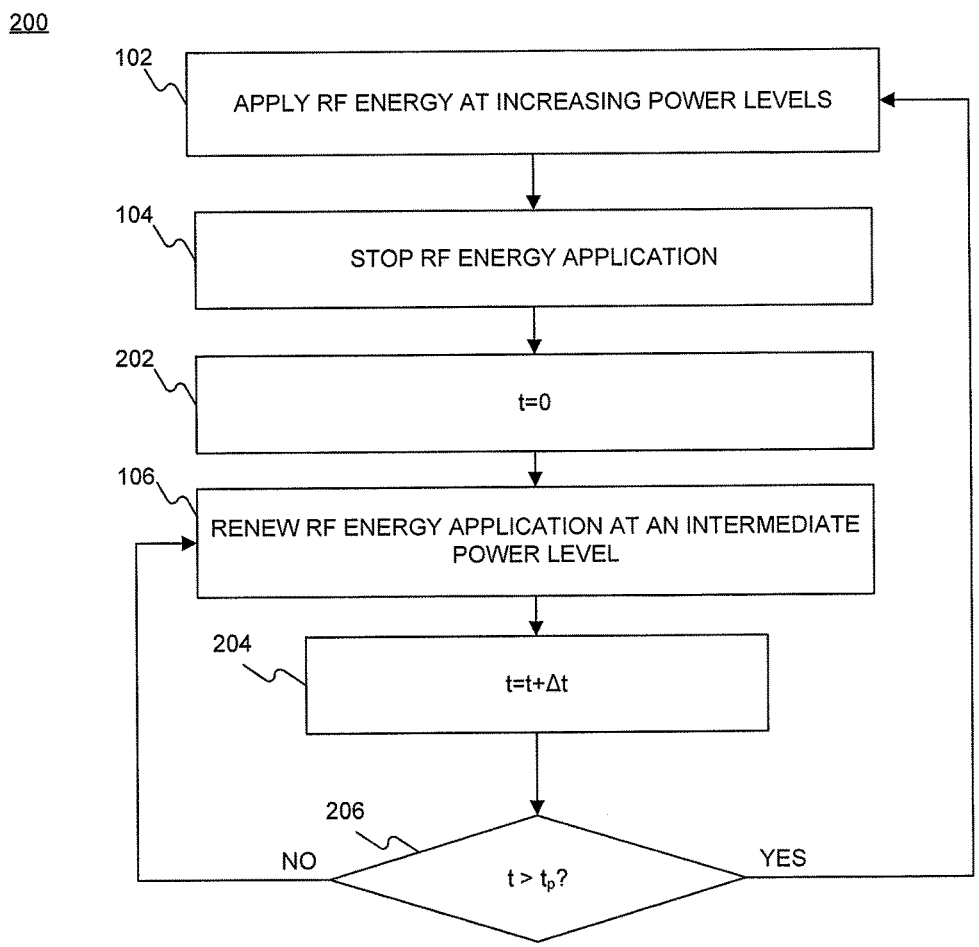
FIG. 2 illustrates a flowchart showing an exemplary method of RF energy application in accordance with some exemplary embodiments of the present invention.

FIG. 2 is a flowchart of a method 200 of applying RF energy to an object according to some embodiments of the invention. The method may include steps 102, 104, and 106 discussed above in relation to method 100. In addition, method 200 may include counting the duration of energy application at step 106. This may be done, for example, by zeroing a clock when step 106 begins (step 202), and advancing the clock as energy application proceeds (step 204). The elapsed time from the commencement of energy application in step 106 may be compared to a predetermined processing time period $t_p$ (step 206). As long as the predetermined processing time has not lapsed, (step 206: NO), energy application continues. When the predetermined processing time lapses (step 206: YES), a new, higher threshold may be searched for by returning to step 102. In this execution of step 102, the initial power level may be the intermediate power level applied during the execution of step 106. Similarly to method 100, method 200 may also be carried out at multiple excitation setups, serially or in an interlacing manner.

Figure 3:
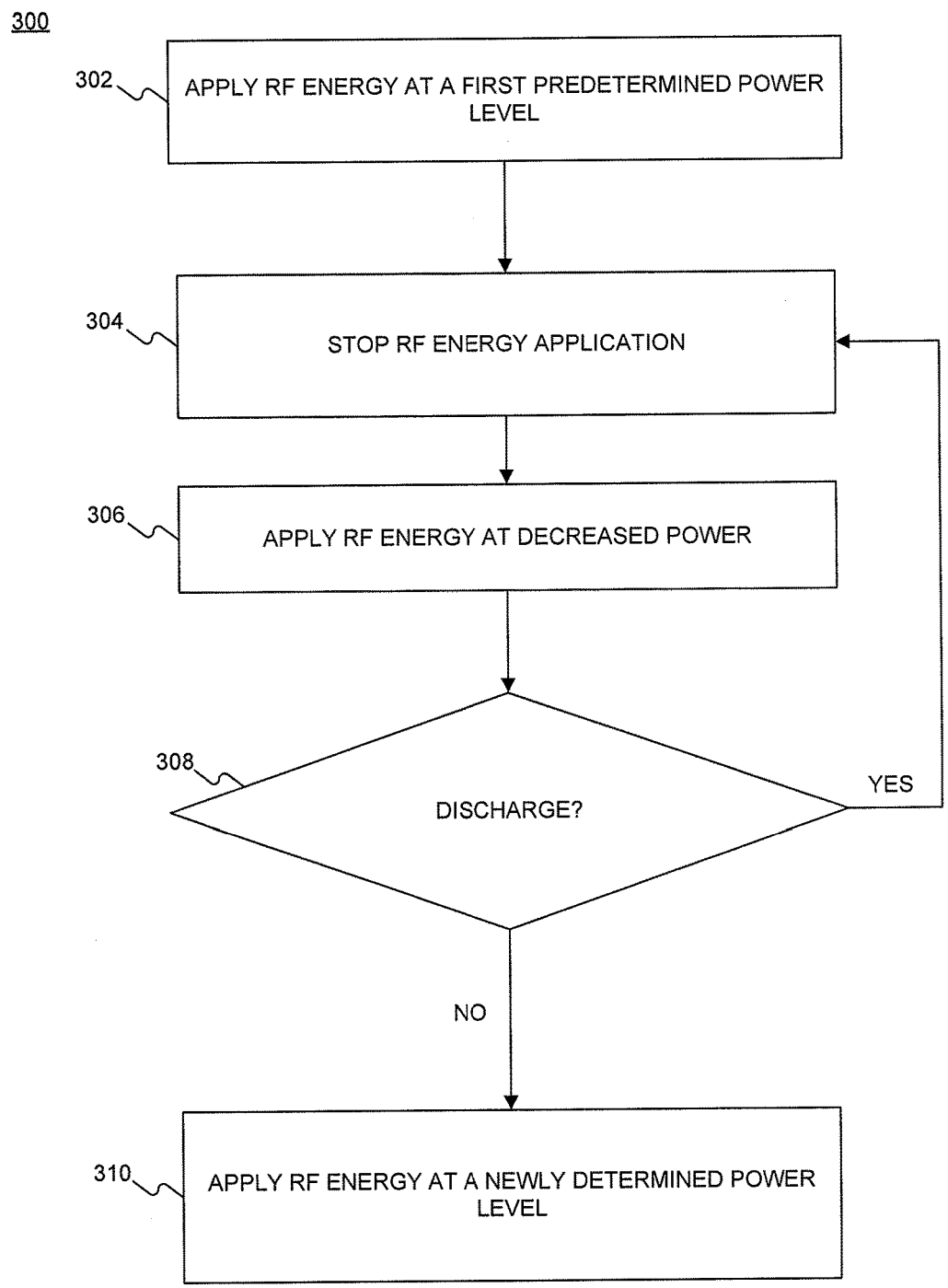
FIG. 3 illustrates a flowchart showing an exemplary method of RF energy application in accordance with some exemplary embodiments of the present invention.

FIG. 3 is a flowchart of a method 300 of applying RF energy to an object according to some embodiments of the invention. Method 300 may include RF energy application at a series of at least two energy application events at decreasing power levels. In some embodiments, each energy application in the series, except for the last one, may be accompanied by an electric discharge. An intermission may take place between each two succeeding energy application events, e.g., to allow decay of the discharge, if the discharge occurred during the energy application that preceded the intermission. In some embodiments, the intermission may be of 10 ms or more.

In some embodiments, method 300 may begin in step 302 with energy application at a first predetermined power level. The first predetermined power level may be the intermediate power level applied at step 106 of method 100 or 200. Method 300 may be initiated because during energy application at step 106 an abrupt and/or significant change in a response parameter was recorded. In some embodiments, the response parameter is measured, continuously or periodically, during the energy application at step 106. The detected significant change may be interpreted as if the discharge power threshold moved to below the level it had when energy application commenced at the predetermined power level (e.g., at t=0 in step 202). Therefore, a new threshold may be searched, starting at the predetermined power level and decreasing in power. In some embodiments, instead of using method 300, method 100 or 200 may be used, with the initial power level being set to a lower power level than the current power level, at which discharge is detected. In some embodiments, the initial power level may be lower than the current power level by a factor of 20 or more, for example, by factor of 30, 50, 80, etc.

In step 304 energy application may be stopped, e.g., at all excitation setups, to provide an intermission similar to that discussed in relation to step 104 of method 100. The intermission may allow an electric discharge to decay. When the intermission ends, energy may be applied at a power level lower than the power level applied before the intermission, e.g. by factor of 2, 3, 4, etc. If an electric discharge occurs again, another intermission may be taken, and energy may be applied in still lower power, until the power is sufficiently low not to cause electric discharge. Then, energy application may continue at a power level that does not cause electric discharge, for example, at the last power level in the series of executions of steps 302-308 or at power level applied just before the last intermission.

In some embodiments, the occurrence of an electric discharge may be detected by comparing values of a response parameter measured before and after the intermission. For example, the value of a response parameter may be compared, in step 308, with that measured before the intermission, and if the difference is greater than a predetermined value (308: YES), the method may return to step 304, causing another intermission, and renewing energy application at a further reduced power level (step 306), until the response parameter remains stable, e.g., does not change in value in comparison to the value it had before the last intermission (308: NO). Then, the method may proceed to step 310, in which a third amount of energy may be applied at a newly determined power level, such as a power level equal to or lower than the power level applied just before the last intermission (e.g., during the one-before-last energy application event in the series). In some embodiments, the third amount of RF energy may be applied at a power level higher than the power level of the last energy application event in the series, for example, at an intermediate power level between the power levels of the two last energy application events in the series.

In some embodiments, a response parameter is considered to change between two points in time, only if a difference in its value as measured in the two points in time is larger than a significance threshold. In some embodiments, the significance threshold may be predetermined, for example, it may be set in advance. To set a significance threshold of a response parameter, above which a difference between values of the response parameter may be considered significant, one may measure the response parameter during many energy application events, under conditions that are safe from discharge. The threshold may be set to a difference that occurred, for example, less frequently than once in a hundred times, once in 1000 times, etc. In some embodiments, the significance threshold may be set as a number of standard deviations of the differences, for example 3, 4, or 4.5 standard deviations. In some embodiments, the significance threshold may be set to a number of ranges of the values of the response parameter had at no discharge. For example, the significance threshold may be set to a value twice as large as the difference between the smallest and largest value of the response parameter measured at no discharge. In some embodiments, for example, if the response parameter is power dependent, the significance threshold may be power dependent. In some embodiments, the power dependent significance threshold may be based on the known or expected dependency of the electromagnetic response parameter on the input power at low power levels. It is noted that under discharge the response parameter may be either higher or lower than in absence of discharge. Thus, setting a threshold value may set a range, ranging from the value of the response parameter at no discharge minus the significance threshold to the no-discharge value plus the significance threshold. When the response parameter is within this range, discharge may be considered not to occur, and power application may continue at the same or increased power level. When the response parameter is outside this range it may be indicative of an electrical discharge, and RF energy application may be adjusted to a lower power level, optionally, after an intermission that allows the discharge to decay.

It is noted that method 300 may be carried out at some excitation setups while method 100 or 200 is carried out at other excitation setups. For example, excitation setups may be swept, and at each excitation setup a step of a method may be carried out independently of the method steps carried out at other excitation setups (except for the intermissions, in those embodiments where the intermission is across all, or more than one of the excitation setups).

Figure 4:
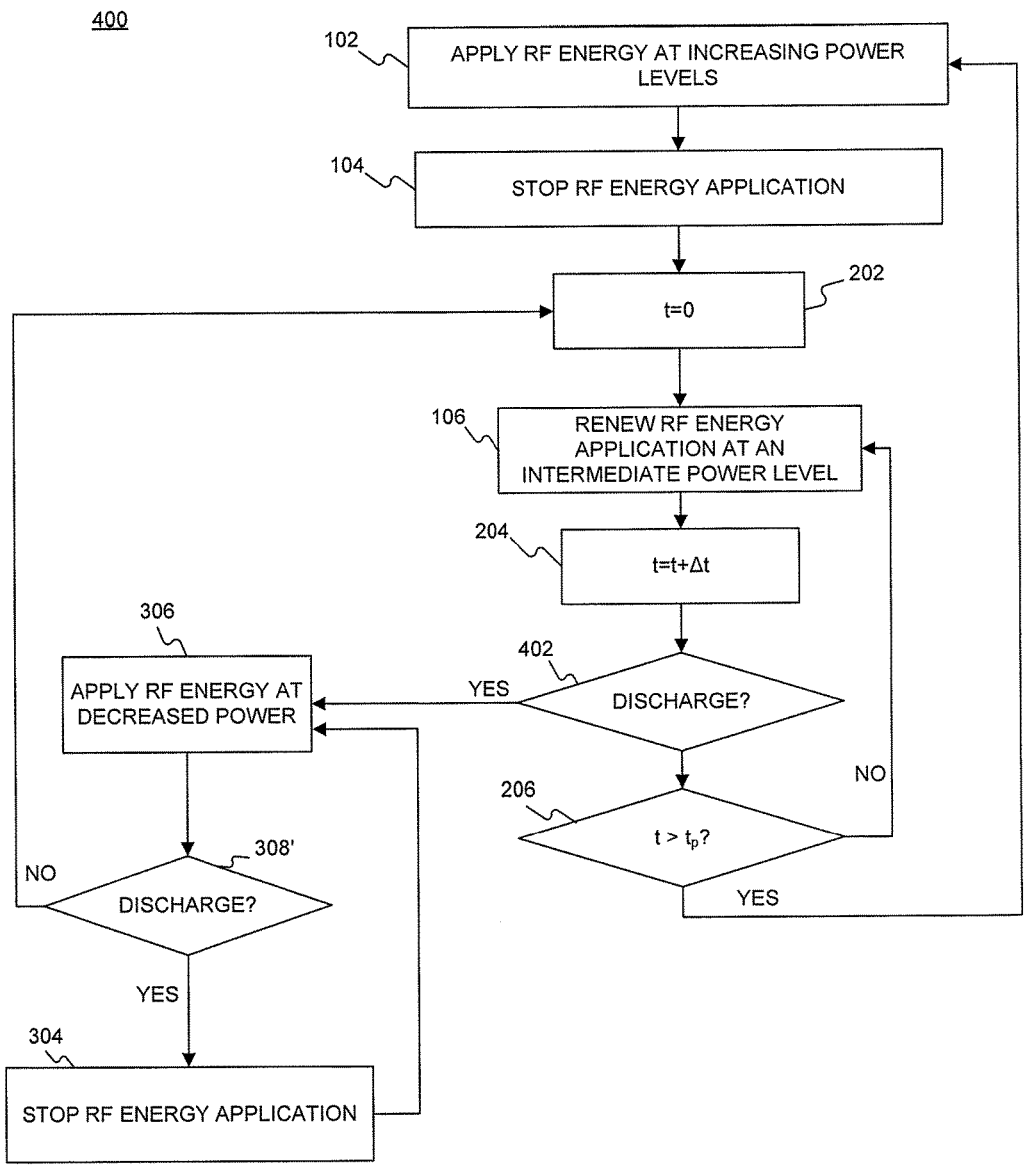
FIG. 4 illustrates a flowchart showing an exemplary method of RF energy application in accordance with some exemplary embodiments of the present invention.

FIG. 4 is a flowchart of an exemplary method 400 of applying RF energy to an object according to some embodiments. Method 400 may incorporate at least part of methods 100, 200, and/or 300. Method 400 may begin with the first five steps of method 200: steps 102, 104, 202, 106, and 204. Then, method 400 may proceed to step 402, at which a value of a response parameter is compared to the value of the same response parameter at a preceding time period during energy application 106. If there is no significant difference (e.g., the absolute value of the difference is smaller than a predetermined significance threshold, which means there is no electrical discharge, step 402: NO), the method may continue to step 206, discussed in the context of method 200. If, on the other hand, the comparison in step 402 revealed a significant difference (e.g., the absolute value of the difference is equal to or greater than a predetermined significance threshold, which means there is an electrical discharge, step 402: YES), the method may continue to step 306, and energy may be applied at a lower power level, and another check if discharge occurred takes place in step 308'. In step 308', just like in step 308 of method 300, the value of a response parameter may be compared with that measured before the intermission, and if changed (step 308': YES), the method may continue to step 304, to another intermission, and another energy application at reduced power level (step 306). If, on the other hand, the RF power did not change its value in comparison to the value it had before the intermission (step 308': NO), energy application may continue at the current power level, or even at the higher power level applied before the intermission, preferably after zeroing the clock at step 202.

Figure 5:
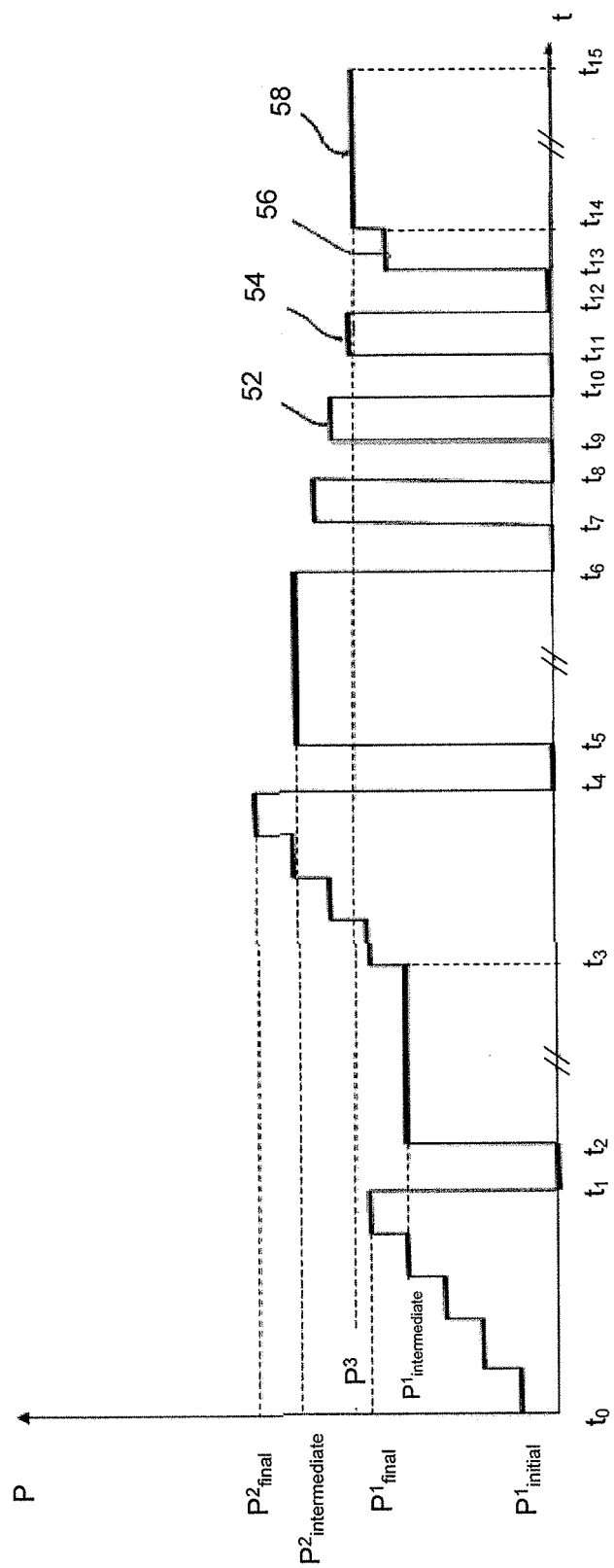
FIG. 5 is a graphical representation of power levels at which energy may be applied when practicing a method according to some embodiments.

FIG. 5 is a graphical representation of power levels at which energy may be applied when method 400 is practiced at a single excitation setup. At $t_0$ a series of short energy application events starts at a power level $P_{initial}^1$ and increases to a final power level $P_{final}^1$, which is higher than $P_{initial}^1$, e.g., as described in relation to step 102 in method 100. In the depicted example, the power level increase from one power application event to another at a constant power difference. After the last power application event in the series, at $t_1$, an intermission may take place until $t_2$, e.g., as described in relation to step 104 of method 100. The length of the intermission appears in the drawing to be similar to the length of each energy application event between $t_0$ and $t_1$, but this is not necessarily so. This intermission may be due to detection of a dark discharge at $t_1$.

At $t_2$ a long power application event may take place until $t_3$. The long energy application event may be longer than any of the energy application events shown in FIG. 5 to take place between $t_0$ and $t_1$. The long energy application event may be, e.g., as described in relation to step 106 of method 100. The long energy application event may be continuous as shown, or may be composed of a plurality of short energy application events, that may (or may not) have intermissions between them. In some embodiments, the length of each of the events composing energy application between $t_2$ and $t_3$ is the same as the length of each energy application event between $t_0$ and $t_1$. The long power application event may be at intermediate power level $P_{intermediate}^1$, lower than $P_{final}^1$ and higher than $P_{initial}^1$.

Then, at $t_3$, another series of energy application events at increasing power levels begins, which may be a result of a decision that a predetermined processing time has lapsed (step 206: YES in method 200 or 400). In the depicted example, the initial power level applied at the series during the second repetition of step 102 is the same as that applied during energy application 106 (i.e., $P_{intermediate}^1$). In this repetition, the final power level is higher than the highest power level at the first repetition ($P_{final}^2 > P_{final}^1$). Then, an intermission takes place until $t_5$, when a long energy application event begins again. The energy application event that begins at $t_5$ is shown to be at an intermediate power level $P_{intermediate}^2$, smaller than $P_{final}^2$ and higher than $P_{final}^2$.

Still referring to FIG. 5, at $t_6$ another intermission begins. This may be the result of a large or abrupt change observed between two values of a response parameter measured at two different times between $t_5$ and $t_6$. After the intermission, energy application resumes, at decreasing power levels and with intermissions between the differing power application events, and another long power application takes place between $t_{14}$ and $t_{15}$, at a power level $P^3$. This may be the result of the response parameter being substantially equal during power application event 56 (between $t_{13}$ and $t_{14}$) and power application event 54 (between $t_{11}$ and $t_{12}$) (step 402: NO in method 400). In such a case, the existence of a discharge power threshold at some power level between those of power application events 52 and 54 may be assumed and therefore, the long energy application event 58 may be at a power level $P^3$ that is about the same as that of power application event 54 (between $t_{11}$ and $t_{12}$).

Figure 6A:
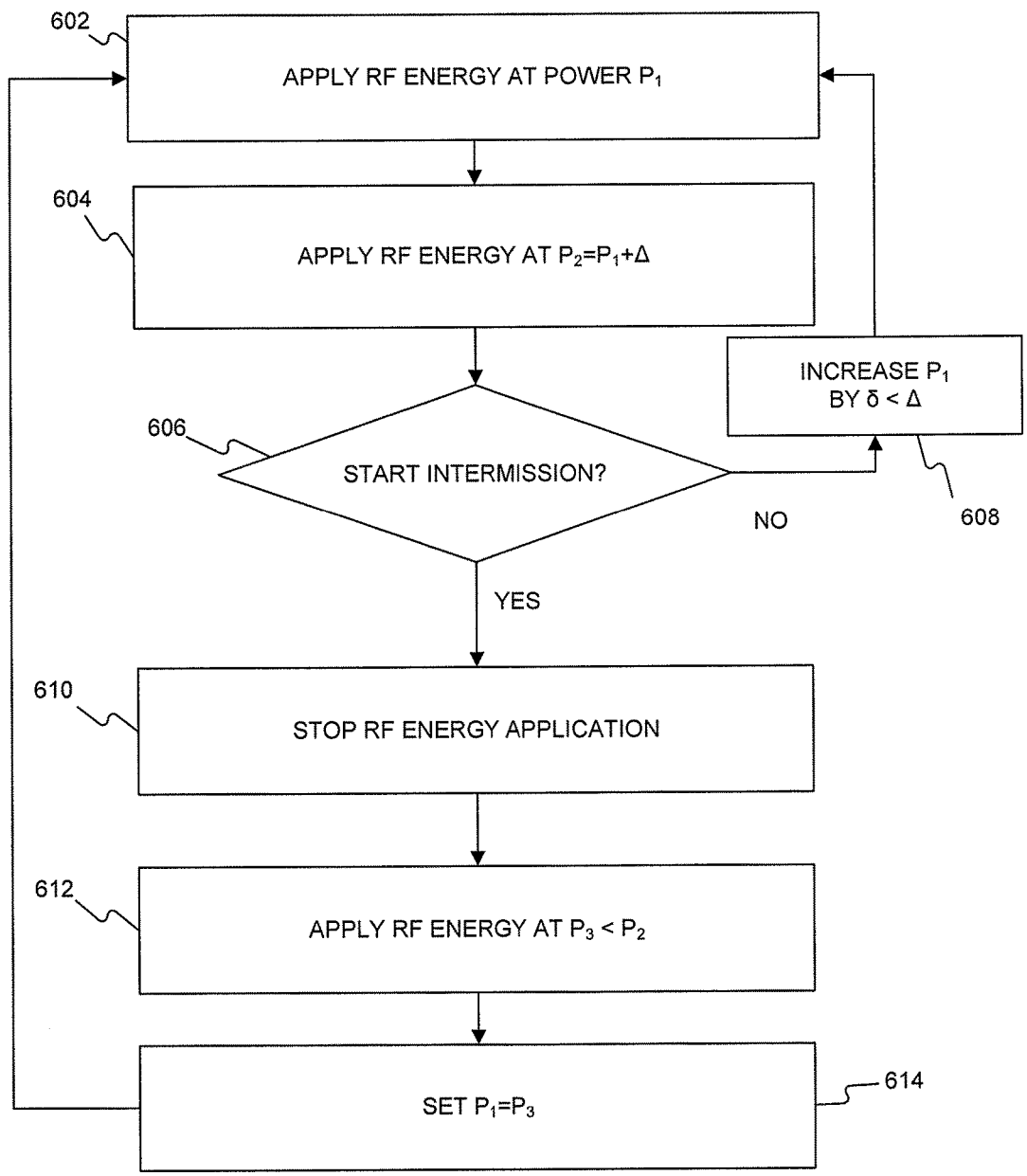
FIG. 6A illustrates a flowchart showing an exemplary method of RF energy application in accordance with some exemplary embodiments of the present invention.

FIG. 6A is a flowchart of a method 600 of RF energy application according to some embodiments. Method 600 may result in a non-monotonic power increase during a search for discharge power threshold, and may be similar to method 100 or 200 discussed above.

Method 600 may include a step 602 of applying an initial energy application event at power level $P_1$. This may be a first energy application event in a series discussed in relation to step 102 in method 100. Method 600 may proceed in step 604 with another energy application event, at power level $P_2$ higher than that applied at step 602. For example, $P_2$ may be equal to $P_1+\Delta$, wherein $\Delta$ is a power difference. This may be the second power application event in the series discussed in relation to step 102 of method 100.

Then, a decision making step 606 may take place. The decision may be whether to start an energy application intermission (step 606: YES) or not (step 606: NO). In some embodiments, the decision may be based on an estimate whether an electric discharge (e.g., dark discharge) occurred (step 606: YES) or not (step 606: NO). An estimate of whether an electric discharge occurred or not may be obtained by comparing values of a response parameter, obtained at two differing power levels. In the absence of an electric discharge, the value of the response parameter may be expected to be power-independent, and not to differ significantly between the two power levels at which it is measured. Some difference may occur, just like between any other two measurements taken under similar conditions.

If it has been decided that dark discharge has not occurred (step 606: NO), method 600 may proceed to step 608, in which power level $P_1$ may be increased, for example, by $\delta$, wherein $\delta$ may be a power difference. In some embodiments, $\delta$ may be smaller than $\Delta$, for example, $\delta$ may be ½ $\Delta$. Then, energy application at the new power level $P_1$ may take place. This may be the third power application event in the series discussed in relation to step 102 of method 100.

If it has been decided that dark discharge has occurred at power level $P_1$ (step 606: YES), the method may proceed to step 610, in which an intermission, e.g., of a predetermined period, may take place. In some embodiments, the intermission may last until it is determined, e.g., by measurement, that the discharge relaxes or decays. Then, method 600 may proceed to step 612, at which energy may be applied at an intermediate power level $P_3<P_2$. For example, in some embodiments, $P_3$ may be equal to $P_1=P_2-\Delta$ or, in other embodiments, to $P_2-\delta$, which is the highest power level applied in the series that did not result in a positive decision (YES) in step 606. $P_3$ may be larger than $P_1$. After energy application at $P_3$ ends, the value of $P_1$ may be set, in step 614, to a power level equal to $P_3$, and the method may proceed to step 602, searching for a new, higher discharge power threshold.

Figure 6B:
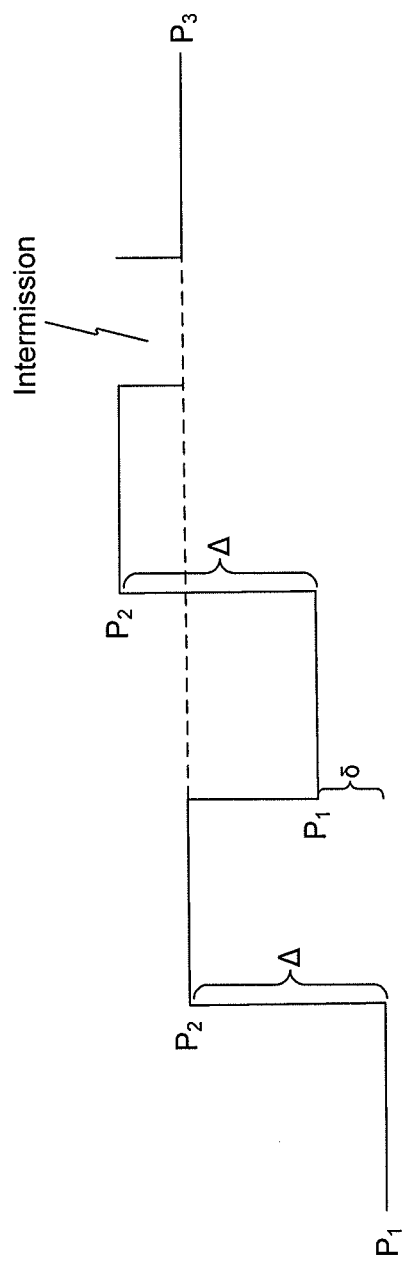
FIG. 6B shows power levels $P_1$, $P_2$, and $P_3$ as may be set when the method outlined in FIG. 6A is carried out under certain circumstances, according to some embodiments of the invention.

FIG. 6B shows power levels $P_1$, $P_2$, and $P_3$ as may be set when method 600 is carried out with 606:NO in a first execution of step 606 and 606:YES in a subsequent execution of step 606. At the left of the drawing, energy is applied at power $P_1$ (step 602). Then, power is applied at power $P_2=P_1+\Delta$ (step 604). Then, energy is applied at a new value of $P_{1new}=P_1+\delta$, which is higher by $\delta$ than the value $P_1$ had before (step 602 after execution of step 608). Then, step 604 is executed again, and power is applied at a new power level $P_{2new}=P_{1new}+\Delta$. This time, it is decided to start an intermission (606:YES, 610). Finally, energy is applied at a power level $P_3$, lower than $P_{2new}$, which in the embodiment shown in FIG. 6B is $P_{2new}-\delta$.

Figure 7:
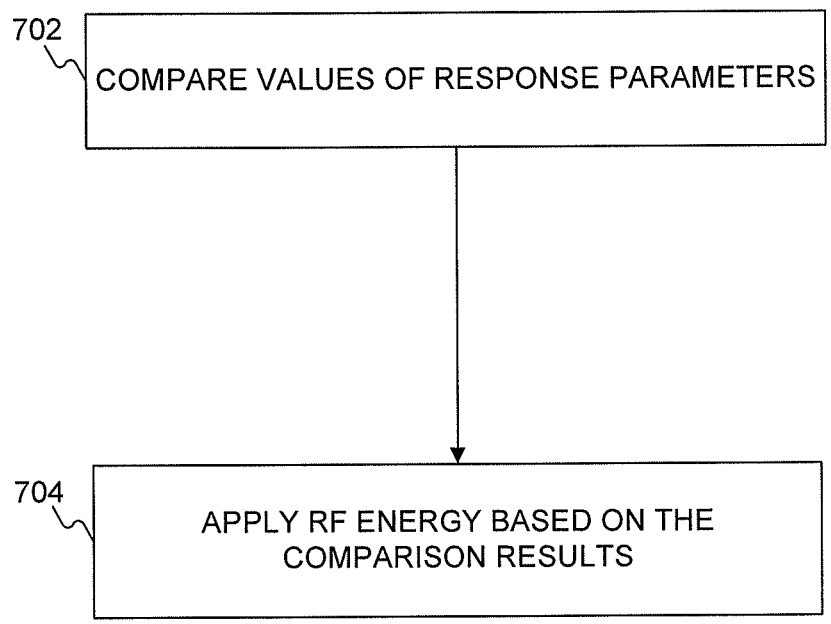
FIG. 7 illustrates a flowchart showing an exemplary method of RF energy application in accordance with some exemplary embodiments of the present invention.

FIG. 7 is a flowchart of a method 700 of applying RF energy to a system comprising an object in a cavity (e.g., in a microwave cavity) according to some embodiments of the invention. Method 700 may include, in step 702, a step of comparing two values of a response parameter. The values of the response parameter may have been obtained during measurements during two RF energy application events. The two events may have been at a common excitation setup and at differing power levels. In some embodiments, the two events may have been at a common excitation setup and at a common power level, but at different times. The latter may be useful, for example, for detecting discharge that occurs due to changes in the discharge setting power threshold. As noted above, a significant difference between values of response parameters measured during energy application at differing power levels may be indicative of a discharge. Similarly, a significant difference between values of response parameters measured during energy application at the same excitation setup and power level but at different times may indicate that a discharge occurred between the two measurements. Definitions of significant differences according to various embodiments are discussed in relation to FIG. 3 above.

Thus, method 700 may further include a step 704 of applying RF energy to the system based on the results of the comparison. For example, when a difference between the two values is larger than a significance threshold, energy application may be stopped, e.g., for an intermission period sufficient to allow an electric discharge, if generated in the system, to decay. This period may be, for example, 10 ms or more. In some embodiments, after the intermission ends, RF energy may be renewed, at a low power level, in comparison to one or both of the power levels at which the compared values of the response parameters were measured. In some embodiments, after the intermission ends, RF energy application may be renewed, at an intermediate power level, between the two power levels at which the two compared values were measured. In another example, when the difference between the two values is smaller than the significance threshold, RF energy application may continue at an increased power level.

In some embodiments RF energy may be applied at two or more different excitation setups. Applying energy at different excitation setups may result in excitation of different field patterns in the energy application zone. The excitation setups may differ from one another by one or more values of parameters that may affect the field pattern and may be controlled by components of the apparatus. Such a parameter is referred to herein as a controllable field affecting parameter (c-FAP). In some embodiments, a value may be selected for each c-FAP, and the excitation setup may be defined by the selected values. Varying a selected value of even one c-FAP varies the excitation setup, which, in turn, may vary the field pattern excited in the energy application zone. In some cases, varying c-FAP values may result in significant variations in the generated field patterns. In other instances, however, varying values of c-FAPs may produce little or no change in the generated field patterns (e.g., if the variation between the two values of the c-FAP is small).

Applying energy at a particular excitation setup may excite an EM field pattern in the energy application zone. For brevity, this excited EM field pattern may be referred to as an excitation. Thus, each excitation setup may correspond to an excitation; and a reference to a supply, reception, absorption, leakage, etc., of an excitation setup may refer to a supply, reception, absorption, leakage, etc., of the corresponding excitation. Thus, for example, a statement that a given excitation or excitation setup is absorbed in the object may mean that energy associated with an electromagnetic field excited by the energy application unit at the given excitation setup is absorbed in the object.

Various apparatuses may allow the control of different field affecting parameters. For example, in some embodiments, an apparatus may include a controller (e.g., a processor) that controls the frequency of an EM wave applied by an energy application unit to the energy application zone. In such apparatuses, the frequency may be available as a c-FAP. In one example, such an apparatus may control the frequency to have any of two or more value (e.g. 800 MHz, 800.5 MHz). By controlling the frequency and changing from one frequency value to another, the excitation setup may be changed, which, in turn, may change an EM field pattern excited in the energy application zone.

In another example, an energy application unit may include two radiating elements that emit radiation at a controllable phase difference. The phase difference may be controlled to have two or more values (e.g., 0°, 90°, 180°, or 270°). The phase difference between EM fields emitted by the two radiating elements may be available to the apparatus comprising the energy application unit as a c-FAP.

In another example, a difference between intensities at which two radiating elements emit EM fields of the same frequency may be controlled, and thus may be available as a c-FAP.

In another example, an energy application zone may include one or more conductive elements (e.g., rods), each of which may be controlled to be either in a floating state or in a connected state. For example, a rod in a floating state may be electrically isolated from sources of electrical potential. A rod in a connected state, however, may be electrically connected to one or more sources of electrical potential (e.g., ground or various voltage levels). A state of each rod (i.e. floating or connected) may affect the EM field pattern excited in the energy application zone. In apparatuses having such rods, the state of each rod may constitute a c-FAP.

In another example, an energy application zone may include a magnetizable element (e.g., at a wall of the energy application zone) and an electromagnet near the magnetizable element. The magnetizable element and the electromagnet may be arranged such that a field pattern excited in the energy application zone may be affected by current flowing in the electromagnet. In some embodiments the current may be controllable and the value of the current (e.g., 1 mA, 20 mA, 500 mA, etc.) may be available as a c-FAP.

In another example, an energy application unit may include a plurality of radiating elements which may be turned on or off, e.g., independently of one another. In such embodiments, the status of each radiating element (e.g., on or off) may be available as a c-FAP. Additionally or alternatively, the total number of radiating elements turned on may constitute a c-FAP.

Other examples of parameters that may serve as controllable field affecting parameters in some embodiments may include the position of a radiating element, orientation of a radiating element, position and/or orientation of conducting elements in the energy application zone, cavity dimensions, or any other' controllable parameter, the value of which may affect a field pattern excited in the energy application zone upon RF energy application to the zone.

Excitation setups including only a single c-FAP may be referred to as one-dimensional excitation setups. An excitation setup including multiple c-FAPs may be referred to as a multi-dimensional excitation setup. For example, an apparatus configured to control the state of each of six rods to be either floating or connected may have a six-dimensional excitation setup. Two examples of such excitation setups may be: (floating, floating, floating, connected, connected, connected), and (floating, connected, connected, floating, floating, connected). In general, the number of c-FAPs available to an apparatus may determine a dimension of the excitation setups available to the apparatus. The collection of all the excitations that may be excited by an apparatus (or the collection of all the excitation setups available to an apparatus) may be referred to as the excitation space of the apparatus. The dimension of an excitation space of an apparatus may be the same as the dimension of each excitation setup available to that apparatus.

In some embodiments, an energy application unit may be controlled by a processor configured to control energy application in accordance with feedback. The feedback may be indicative, for example, of the temperature, weight, position, volume, pressure or any other characteristic of the object or of the surrounding of the object. Additionally or alternatively, the feedback may include electromagnetic (EM) feedback.

As used herein, EM feedback may include any received signal or any value calculated based on one or more received signals, which may be indicative of the dielectric response of the cavity and/or the object to EM fields excited in the cavity. For example, EM feedback may include input and output power levels, network parameters (e.g., S parameters, Y parameters, reflection and transmission coefficients, impedances, etc., as well as values deliverable from such parameters). Examples of deliverable values may include dissipation ratios (discussed below), time or excitation setup derivatives of any of the above, etc. EM feedback may be excitation-dependent, for example, may include signals, the values of which may vary over different excitation setups. Therefore, EM feedback measured when energy is applied at various excitation setups may be used for controlling energy application. A value of a signal included in EM feedback, and/or values calculated based on one of more of the received signals may be referred to herein as values of response parameters.

One parameter that may serve as an example of a response parameter is a dissipation ratio. A dissipation ratio may be a ratio between energy absorbed in the object ($E_{abs}$) and energy input into the cavity ($E_{in}$). Thus, in some embodiments, the dissipation ratio may be defined as:

$$DR = \frac{E_{abs}}{E_{in}}$$

Similarly, the dissipation ratio may be defined as a ration between power absorbed in the object and power input into the cavity:

$$DR = \frac{P_{abs}}{P_{in}}$$

The absorbed energy may be estimated as the difference between the input energy and energy returned from the cavity ($E_{ret}$). This estimation may be accurate if no energy is lost in loss constituents other than the object. Loss constituents other than the object may include cavity walls, trays or other components inside the cavity, a seam between cavity door and cavity body, etc. Thus, in some embodiments, the absorbed energy may be equated with $E_{in}-E_{ret}$; and the DR may be written as $$DR = \frac{E_{in} - E_{ret}}{E_{in}} = 1 - \frac{E_{ret}}{E_{in}}$$

In systems where a single radiating element is provided for inputting and receiving RF energy, the returned energy may consist of energy reflected back to the inputting radiating element ($E_{ref}$), in which case the following equation may apply:

$$DR = 1 - \frac{E_{ref}}{E_{in}}$$

When several radiating elements are provided and supply energy at differing frequencies, each radiating element may be characterized by a different dissipation ratio. A dissipation ratio may be defined when only one radiating element is inputting energy into the cavity at a time. The other radiating elements may receive energy at that time. The returned energy may be equated in such a case to the sum of the amount of energy reflected to the inputting radiating element and the amount of energy coupled to the other radiating elements. An expression that describes DR may then be $$DR^1 = 1 - \frac{E_{ref}^1 + E_{coupled}^{1 \to other}}{E_{in}^1}$$

For example, when three radiating elements are provided, DR at radiating element No. 1 may be defined as $$DR^1 = 1 - \frac{E_{ref}^1 + E_{coupled}^{1 \to 2} + E_{coupled}^{1 \to 3}}{E_{in}^1}$$

Wherein $E_{coupled}^{1 \to 2}$ stands for the amount of energy coupled from radiating energy No. 1 to radiating element No. 2, and $E_{coupled}^{1 \to 3}$ stands for the amount of energy coupled from radiating energy No. 1 to radiating element No. 3. The superscript 1 signifies that the expression is for the dissipation ratio characterizing radiating element No. 1. The above expressions may also be written in terms of powers, e.g., $$DR^1 = 1 - \frac{P_{ref}^1 + P_{coupled}^{1 \to other}}{P_{in}^1}$$

In some embodiments, where energy is applied through a plurality of antennas at a common frequency and during overlapping time periods (also referred to herein as coherent energy application), some additional response parameters may be of interest, for example gamma parameters, defined, for example, for antenna No. 1 as $$\Gamma_1 = \frac{P_{rec}^1}{P_{in}^1}$$

wherein $P_{in}^1$ is the power (or energy) applied through antenna No. 1 and $P_{rec}^1$ is the power (or energy) received from the cavity through antenna No. 1. Also, in coherent energy application the dissipation ratio may be defined for the entire system, and not for each antenna separately. A coherent DR may be given, for example, by the expression $$DR = \frac{\sum_i P_{in}^i - P_{rec}^i}{\sum_i P_{in}^i} = 1 - \frac{\sum_i P_{rec}^i}{\sum_i P_{in}^i}$$

In some embodiments, electromagnetic response parameters may include intensity (or amplitude) of electrical field in the energy application zone. Each response parameter may be, for example, a field intensity measured at a certain location in the energy application zone. In some embodiments, field intensities may be measured at a plurality of locations within the energy application zone. This way, sensors located at locations where the field is most strongly affected by the dark discharge may be more sensitive to dark discharge than sensors located at other places. Therefore, in some embodiments, when a field is detected to change with power in an unexpected manner by one of the sensors, this may be an indication to a dark discharge even if the field measured at other locations responds to power changes as expected.

In some embodiments, when energy is applied at multiple excitation setups, energy application at differing excitation setups may occur at different times. For example, method 100 of FIG. 1 may be practiced at one excitation setup, energy application may stop, and renewed at the same excitation setup, but at an intermediate power level. Then, the method may be practiced with a second excitation setup.

In some embodiments energy application in multiple excitation setups may interlace. For example, RF energy may be applied in sweeps, wherein in each sweep energy is applied at each of the multiple excitation setups. When method 100 is practiced in such a manner, step 102 may include energy application at a first power level at each of a plurality of excitation setups, and a value of a response parameter (e.g., a value of DR) measured at each of the excitation setups at the first power level may be recorded. Step 102 may further include energy application at a second power level, higher than the first, at each of the plurality of excitation setups, and the values of the response parameter may be again recorded. At each excitation setup, the values recorded at the two power levels may be compared. If the difference is too small to be significant (e.g., below a significance threshold), this process may continue until energy is applied at all excitation setups at the second power level. If at one of the excitation setups the difference was found to be significant, there may be a stop (step 104) in energy application, and the excitation setup may be marked. Then, energy application may continue with the other excitation setups. Step 102 may then continue with all the non-marked excitation setups. When energy is to be applied at the marked excitation setup, it may be applied at an intermediate power level (step 106), while at the other excitation setups step 102 may continue, and energy may be applied at an increased power level.

Figure 8:
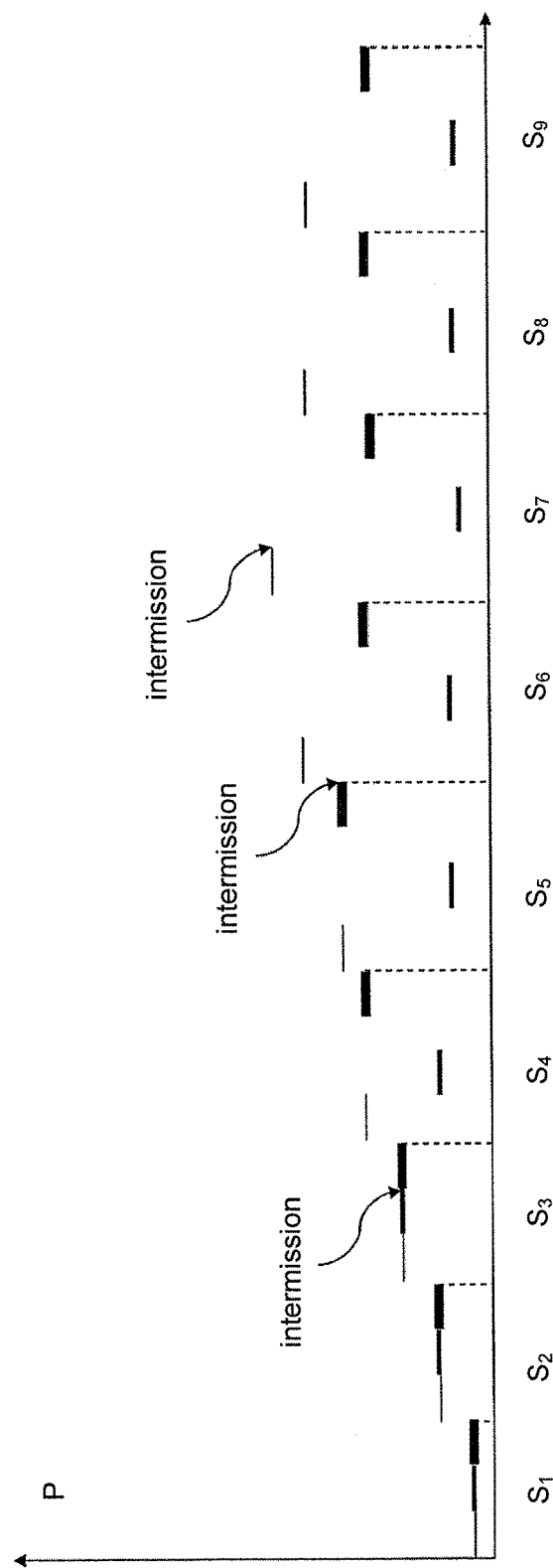
FIG. 8 is a graphical illustration of energy application at three excitation setups according to some embodiments.

FIG. 8 illustrates energy application at three excitation setups at an interlacing embodiment. The horizontal axis is the axis of energy application events, but not necessarily of time lapsing from the beginning of the process. For example, energy application events may change in length along the process. The vertical axis represents the applied power. In FIG. 8, energy application events at three excitation setups are shown, each represented by a line of a different thickness. Nine sweeps are shown, and numbered from S1 to S9. Between the first and second sweep power was increased (step 102), and the response parameter did not change significantly at any of the three excitation setups. Therefore, at the third sweep, energy was applied at a still increased power level at each of the three excitation setups. However, between the second and third sweep, there was a significant difference in the response parameter associated with the second excitation setup (marked by line of intermediate width). Therefore, just after energy application at the second excitation setup during S3 there was an intermission (step 104). The occasions at which intermissions in RF energy application may occur are marked with curled arrows. In the following sweeps, energy application at the second excitation setup is at an intermediate level, between that applied in S3 and in S1 (step 106). Energy application at the second excitation setup remains at this intermediate level for all the preceding sweeps shown in the figure.

In the first excitation setup (thinnest line) power increased from S1 to S7 (step 102), and decreased to an intermediate power level (step 106) in S8. In the third excitation setup (thickest line) power increased from S1 to S5, and decreased to an intermediate power level in S6.

In some embodiments, each sweep may include more than one energy application at each excitation setup. For example, a sweep may include a pair of energy applications at the same excitation setup, at two different power levels, and the value of the response parameter may be compared within a sweep, in addition to or instead of the inter-sweep comparisons discussed in relation to FIG. 8. For example, in some embodiments, each sweep may contain energy application at hundreds of excitation setups, and may take quite long. In such embodiments, it may be prudent to make inter-sweep comparisons even if intra-sweep comparisons are used, because from one sweep to another the discharge power threshold may change, e.g., go down.

Figure 9:
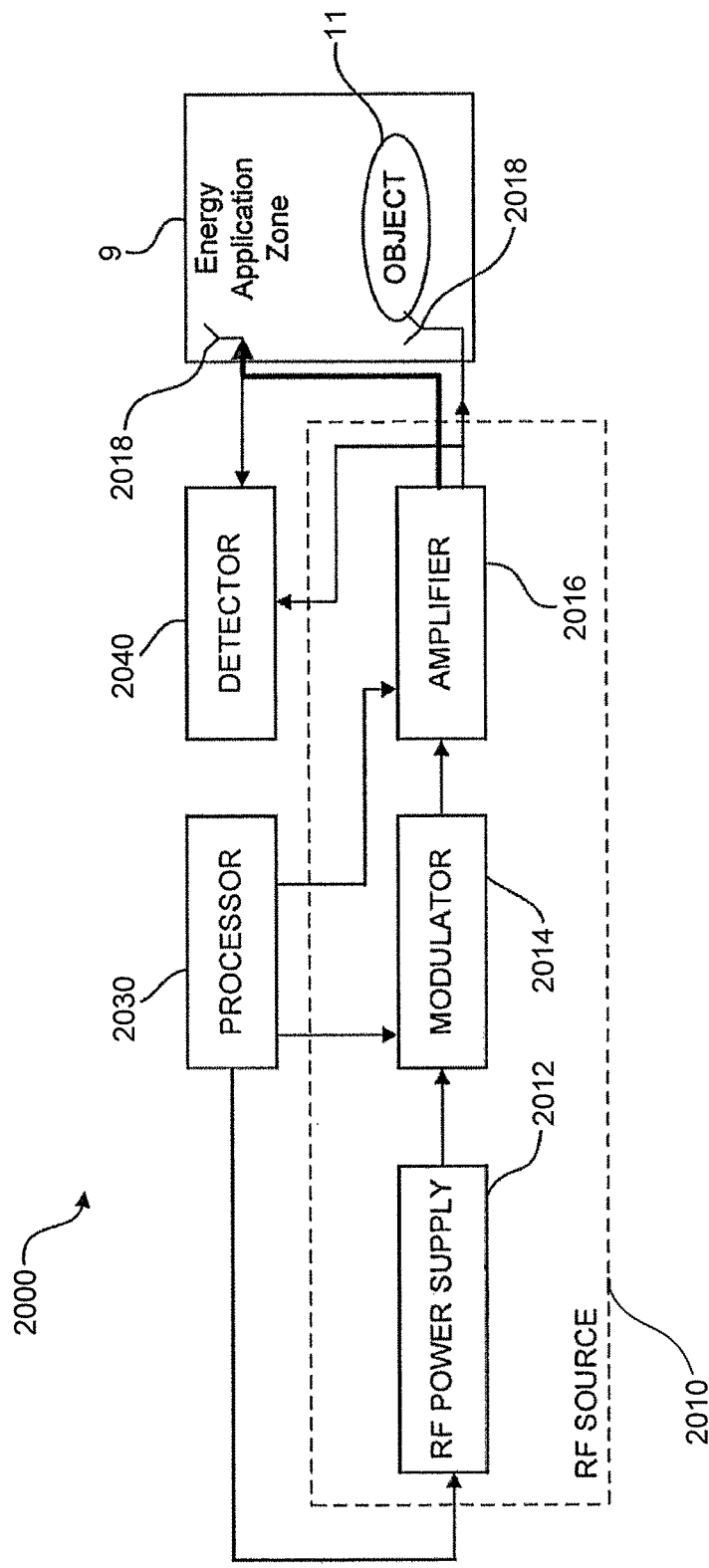
FIG. 9 is a diagrammatical representation of an apparatus for applying RF energy to an object according to some embodiments.

Some embodiments of the invention may include an apparatus for carrying out any of the above methods, and/or an apparatus utilizing any of the above methods. For example, FIG. 9 provides a diagrammatic representation of an exemplary apparatus 2000 for applying RF energy to an object, in accordance with some embodiments of the present invention. Apparatus 2000 may include at least one processor 2030 which may regulate modulations performed by a modulator 2014. In some embodiments, modulator 2014 may include at least one of a phase modulator, a frequency modulator, and an amplitude modulator configured to modify the phase, frequency, and/or amplitude of an EM wave generated by RF power supply 2012, e.g., in order to apply RF energy at a plurality of excitation setups. In some embodiments, the RF power supply may include a direct digital synthesizer (DDS), which may control frequency, amplitude, and phase of signals it generates, and modulator 2014 may be omitted. In some embodiments, processor 2030 may determine the excitation setup at which energy is applied. In some embodiments, apparatus 2000 may involve the use of at least one source 2010 configured to deliver EM energy to the energy application zone. By way of example, and as illustrated in FIG. 9, the source may include one or more of an RF power supply 2012 configured to generate EM waves (also referred to herein as AC waveforms) that carry EM energy. For example, power supply 2012 may be a magnetron configured to generate high power microwave waves at a predetermined wavelength or frequency. Alternatively or additionally, power supply 2012 may include a semiconductor oscillator, such as a voltage controlled oscillator, configured to generate AC waveforms (e.g., AC voltage or current) with a constant or varying frequency. Forms of the EM waves may include sinusoidal waves, square waves, pulsed waves, triangular waves, or another type of waveforms with alternating polarities. Alternatively or additionally, source 2010 of EM energy may include any other power supply 2012, such as EM field generator, EM flux generator, or any mechanism for generating vibrating electrons.

Processor 2030 may alternatively or additionally regulate at least one of location, orientation, and configuration of one or more radiating elements 2018, for example, using an electro-mechanical device. Such an electromechanical device may include a motor or other movable structure for rotating, pivoting, shifting, sliding or otherwise changing the orientation and/or location of one or more of radiating elements 2018.

As used herein, the term "processor" may include an electric circuit that performs a logic operation on input or inputs. For example, such a processor may include one or more integrated circuits, microchips, microcontrollers, microprocessors, all or part of a central processing unit (CPU), graphics processing unit (GPU), digital signal processors (DSP), field-programmable gate array (FPGA) or other circuit suitable for executing instructions or performing logic operations. The instructions executed by the processor may, for example, be pre-loaded into the processor or may be stored in a separate memory unit such as a RAM, a ROM, a hard disk, an optical disk, a magnetic medium, a flash memory, other permanent, fixed, or volatile memory, or any other mechanism capable of storing instructions for the processor. The processor(s) may be customized for a particular use, or may be configured for general-purpose use and may perform different functions by executing different software.

If more than one processor is employed, all may be of similar construction, or they may be of differing constructions electrically connected or disconnected from each other. They may be separate circuits or integrated in a single circuit. When more than one processor is used, they may be configured to operate independently or collaboratively. They may be coupled electrically, magnetically, optically, acoustically, mechanically or by other means permitting them to interact.

The at least one processor may be configured to cause EM energy to be applied to energy application zone 9 via one or more radiating elements 2018, for example across a series of excitation setups, in order to apply EM energy at each such excitation setup to an object 11. For example, processor 2030 may be configured to regulate one or more components included in an RF source 2010 in order to cause the energy to be applied.

In certain embodiments, processor 2030 may be configured to determine a value of one or more response parameters at each of a plurality of excitation setups. This may occur, for example, by testing an object in an energy application zone to determine values of the one or more response parameters. One exemplary way to conduct such a test is through a sweep. As used herein, a sweep may include, for example, the transmission over time of energy at more than one excitation setup. For example, a sweep may include the sequential transmission of energy at multiple excitation setups; and/or the transmission of synthesized pulses having a desired excitation setup/power spectral content (e.g., a synthesized pulse in time). During an excitation setup sweeping process, processor 2030 may regulate the energy supplied to the one or more radiating elements 2018 to sequentially deliver EM energy at various excitation setups to energy application zone 9, and to receive feedback which serves as an indicator of the response parameters characterizing object 11.

During the sweeping process, RF source 2010 may be regulated by processor 2030 based on EM feedback detected by a detector 2040 as illustrated in FIG. 9. Processor 2030 may then determine a value of a response parameter characteristic of object 11 at each of a plurality of excitation setups based on the received EM feedback.

In some embodiments, processor 2030 may be further configured to regulate an amplifier 2016 to adjust power level at which RF energy may be supplied to radiating elements 2018, based on a feedback signal. For example, processor 2030 may be configured to control amplifier 2016 to supply no power to radiating elements 2018 responsive to receiving feedback indicative of an abrupt change in a response parameter characterizing object 11 at a certain excitation setup. In some embodiments, processor 2030 may be configured to regulate amplifier 2016 to renew power supply after an intermission period, at power levels lower than applied before the intermission. In some embodiments, processor 2030 may be configured to regulate source 2010 so as to implement any method described above.

EXAMPLE

Figure 10:
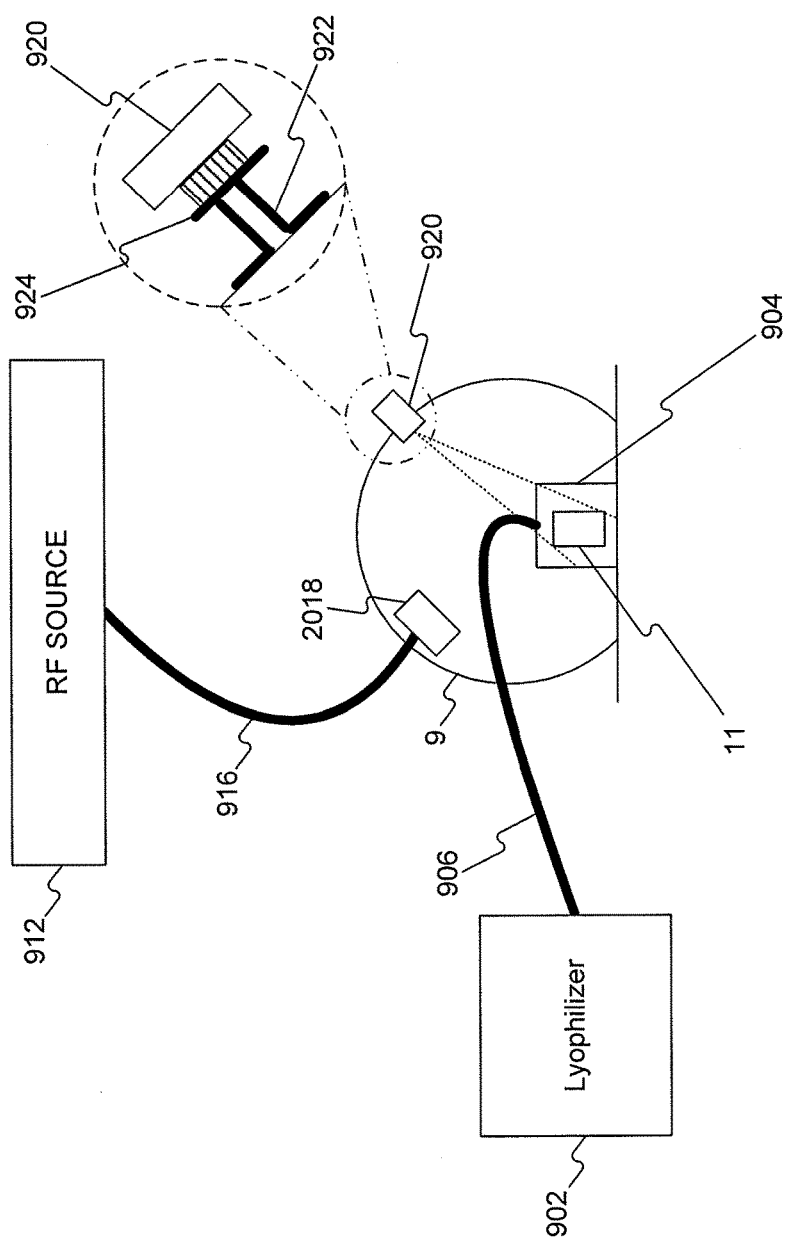
FIG. 10 is a diagrammatical representation of a system for freeze drying using RF energy according to some embodiments.

The method of FIG. 4 was practiced in a freeze-dry experiment, in which a sample of saline solution was dried in a freeze-dryer with RF energy application. The sample included 6 test tubes with 15 cc saline solution in each. The system used in practice is diagrammatically shown in FIG. 10. The same reference numbers are used throughout FIGS. 9 and 10 to refer to the same or like parts.

Lyophilizer 902 was used to pump out and condense gas from a container 904. Container 904 held a sample 11 of the saline solution to be freeze-dried, and was held in an RF cavity 9. RF energy was applied to cavity 9 from an RF source 912 (which may include, for example, RF source 2010, processor 2030 and detector 2040) via radiating element 2018. Radiating element 2018 was connected to RF source 912 with a coaxial waveguide 916. To allow seeing the sample during the drying process, a camera 920 was installed in cavity 9. The camera was connected to cavity 9 with a hollow antenna connector 922, and was protected from RF in cavity 9 with a semi-transparent RF absorbing foil 924. The dotted lines emerging in the drawing from camera 920 to the floor of cavity 9 through sample 11 illustrates the field of view of the camera.

In operation, sample 11 was placed in container 904, vacuum pump 906 was connected to the container and to lyophilizer 902, and lyophilizer 902 was turned on to reduce the pressure in container 904 and condense the gases thus evacuated from container 904. In addition, RF energy was applied according to method 400, at frequencies of between 0.8 GHz and 1.0 GHz and between 2.3 GHz and 2.6 GHz.

Figure 11:
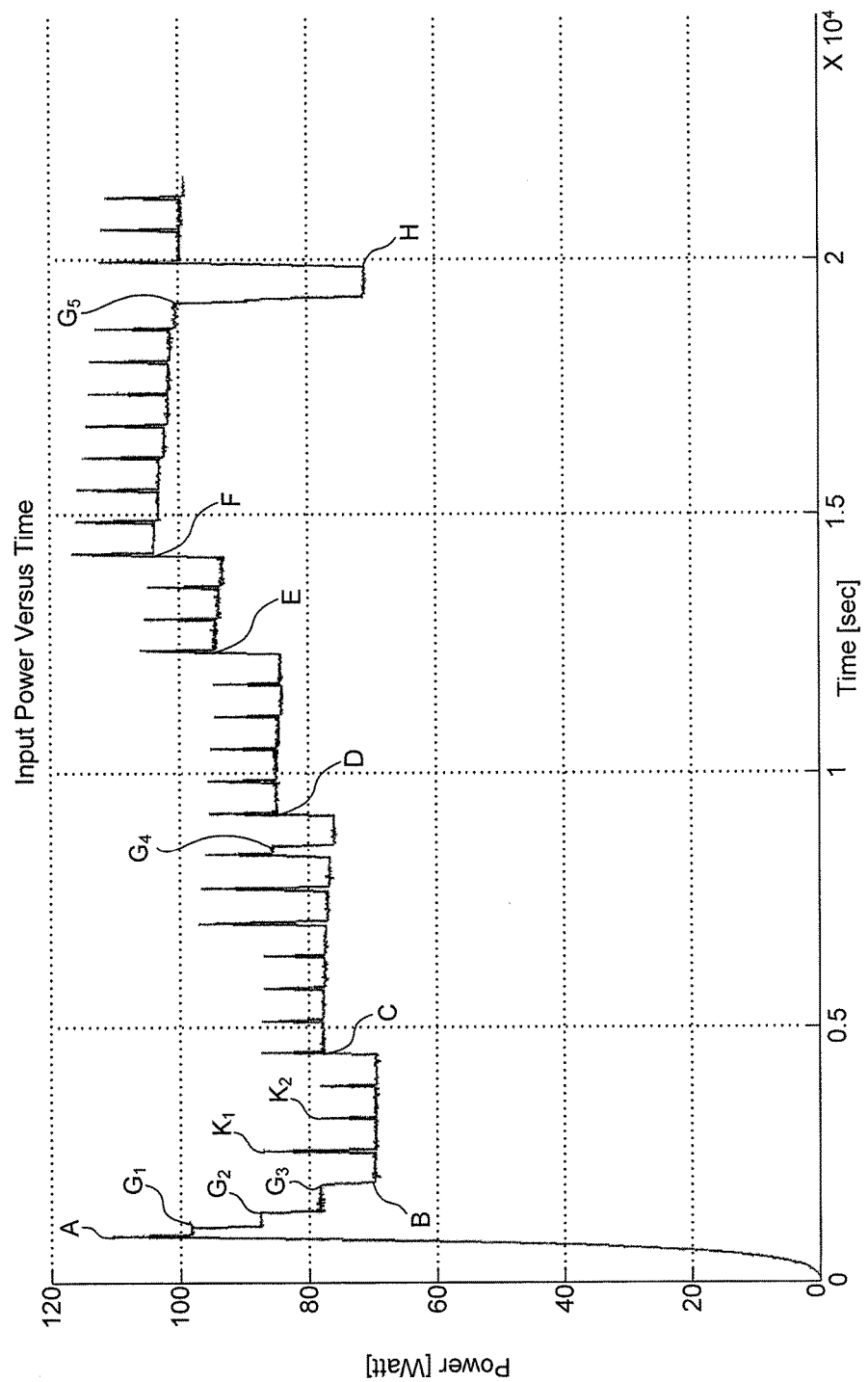
FIG. 11 is a graphical presentation of power levels used in an experiment carried out in the system of FIG. 10 according to some embodiments.

FIG. 11 shows the results obtained in the above experiment, at frequency 967 MHz, in terms of RF power applied along a period of 6 hours. The frequencies were applied in interlacing manner. When the experiment began, the pressure above the saline to be freeze-dried is very low, and therefore, high input power may be applied without onset of a discharge. Without being bound to theory, it is believed that the power starts decreasing, at point A, because sufficient RF power was supplied to the saline to initiate sublimation, and thus increase the pressure to values at which discharge does happen. Pressure continues to build and the discharge power threshold continues to drop until about point B, where the power reaches a level that stays constant for about 10 minutes, which was the processing time ($t_p$, see step 206 in FIGS. 2 and 4) used in the experiment. At this stage, searches for a higher threshold were taken every 10 minutes until a higher discharge power threshold was indeed found, at point C. Similar increases in the discharge power threshold are seen in points D, E, and F.

The results shown in FIG. 11 also include some points at which the discharge power threshold decreased during a processing period (step 402: Yes, in FIG. 4). These points include, for example, points $G_1$, $G_2$, $G_3$, $G_4$, and $G_5$. At each of these points a dark discharge may have been detected by the apparatus, and the input power decreased to a level where no discharge occurred. At $G_5$, the decrease in power was very large, and then recovered at the next attempt to search for a higher threshold level, at point H. The applicants do not have a verified explanation to the sharp decrease in input power at point G5, but suggest that this is in response to some abrupt passing change in the conditions, e.g., an abrupt and short pressure rise. In addition to points G1-G5, dark discharge may also have occurred at each spike, e.g., K1, K2, etc., however, during the entire six hours, there was no corona discharge, and the water content of the saline sample dropped by 70%.

Figure 12:
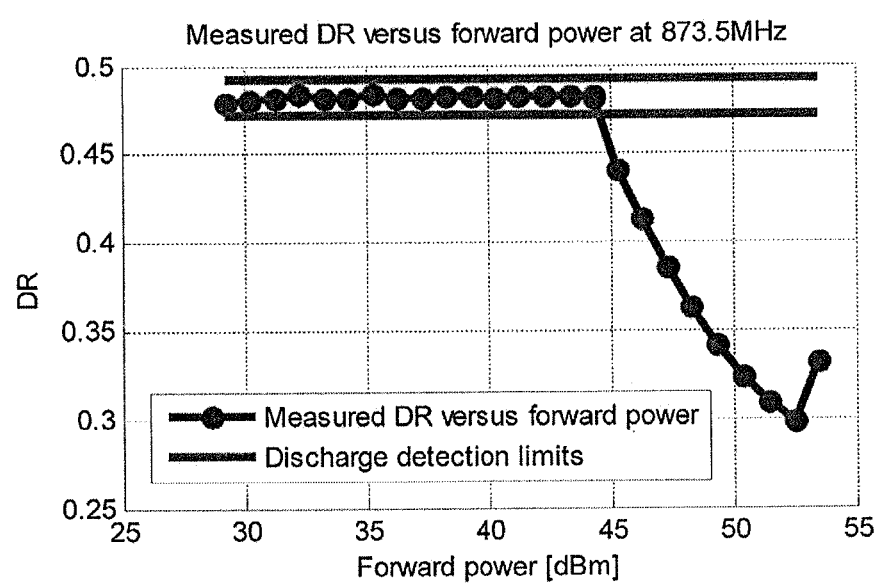
FIG. 12 is a graph showing experimental results obtained without stopping RF application when dark discharge is detected.

FIG. 12 is a graph showing experimental results obtained with the apparatus shown in FIG. 11, but without stopping RF application when dark discharge is detected. The circles show values of a response parameter (DR) measured at differing power values. The two thick straight lines show thresholds, between which the measured values fluctuate in absence of discharge. A camera detected corona discharge (a glow), only when the highest power was applied. As can be seen, the value of the response parameter changed significantly already at power of 45 dBm, while glowing was observed only at power level of about 53 dBM. The crossing of the horizontal line by the measured values may be identified, according to the present invention, as dark discharge. Stopping RF energy application at any stage after that point and before glow was observed by the camera, would have resulted in prevention of the corona discharge.

In the foregoing description of exemplary embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the invention, as claimed. For example, one or more steps of a method and/or one or more components of an apparatus or a device may be omitted, changed, or substituted without departing from the scope of the invention. Thus, it is intended that the specification and examples be considered as exemplary only, with a true scope of the present disclosure being indicated by the following claims and their equivalents.

What is claimed is:

1. A method of heating an object in an energy application zone by applying RF energy to the energy application zone without causing a visible electrical discharge, the method comprising:
    applying RF energy to the energy application zone at a first power level,
    measuring a value of an electromagnetic response parameter indicative of the electromagnetic response of the energy application zone to the applying of RF energy;
    intermitting the application of RF energy after the value of the electromagnetic response parameter is measured to be outside a predetermined range and before a visible electrical discharge occurs;
    renewing RF energy application after intermission at a second power level, wherein the second power level is lower than the first power level; and
    performing a sequence of RF energy application events with an intermission event between each two succeeding energy application events in the sequence, wherein a power level of each RF energy application event is lower than a power level of a preceding RF energy application event in the sequence,
    wherein each intermission event is sufficiently long to allow discharge, if occurring during the RF energy application event preceding the intermission event, to decay completely.

2. The method according to claim 1, wherein the electromagnetic response parameter comprises at least one of: field intensity in the energy application zone, field amplitude in the energy application zone, S parameters, Z parameters, T parameters, ABCD parameters, gamma parameters, or dissipation ratios.

3. The method according to claim 1, wherein the intermitting the application of RF energy comprises intermitting for a period of predetermined length.

4. The method according to claim 1, wherein the intermitting the application of RF energy comprises intermitting for a period of at least 10 milliseconds.

5. The method according to claim 1, further comprising increasing the first power level when the value of the electromagnetic response parameter is measured to be inside the predetermined range.

6. The method according to claim 1, further comprising:
    measuring a value of the electromagnetic response parameter indicative of the electromagnetic response of the energy application zone to the RF energy application at the second power level,
    intermitting the RF energy application if the value is measured to be outside the predetermined range, and
    renewing the RF energy application at a third power level, lower than the second power level.

7. The method according to claim 1, wherein an amount of RF energy applied at the second power level is larger than an amount of RF energy applied at the first power level by a factor of at least 50 times.

8. The method according to claim 1, wherein the intermitting RF energy application starts within 10 milliseconds after the electromagnetic response parameter is measured to be outside the predetermined range.

9. The method according to claim 1, further comprising:
    applying RF energy to the energy application zone using a plurality of excitation setups,
    wherein RF energy application at each of the plurality of excitation setups comprises:
        applying RF energy to the energy application zone at a first power level, measuring a value of an electromagnetic response parameter indicative of the electromagnetic response of the energy application zone to the RF energy application;

intermitting the application of RF energy after the value of the electromagnetic response parameter is measured to be outside a predetermined range and before visible electrical discharge occurs; and renewing RF energy application after the intermission at a second power level, wherein the second power level is lower than the first power level.

10. The method according to claim 9, wherein intermitting RF energy application comprises intermitting RF energy application at the plurality of excitation setups at the same time.

11. The method according to claim 9, wherein RF energy applications at differing excitation setups interlace.

12. A method of heating an object in an energy application zone by applying RF energy to the energy application zone without causing a visible electrical discharge, the method comprising:

applying RF energy to the energy application zone at a first power level, measuring a value of an electromagnetic response parameter indicative of the electromagnetic response of the energy application zone to the applying of RF energy;

intermitting the application of RF energy after the value of the electromagnetic response parameter is measured to be outside a predetermined range and before a visible electrical discharge occurs; and renewing RF energy application after intermission at a second power level, wherein the second power level is lower than the first power level; and performing a sequence of RF energy application events with an intermission event between each two succeeding energy application events in the sequence, wherein a power level of each RF energy application event is lower than a power level of a preceding RF energy application event in the sequence, wherein after the sequence of RF energy application events is performed, RF energy is applied at a power level lower than or equal to a power level of a penultimate RF energy application event in the sequence.

13. The method according to claim 12, wherein each intermission event is performed after measuring a value of the electromagnetic response parameter outside the predetermined range.

14. The method according to claim 12, wherein each intermission event is sufficiently long to allow discharge, if occurred during the RF energy application event preceding the intermission event, to decay completely.

* * * * *